(12) United States Patent
Ogino

(10) Patent No.: US 7,162,660 B2
(45) Date of Patent: Jan. 9, 2007

(54) SEMICONDUCTOR MEMORY AND METHOD OF TESTING THE SAME

(76) Inventor: Hiroyuki Ogino, 1-4, Fudomae-cho 6-chome, Imadegawa-agaru, Teramachi, Kamigyo-ku, Kyoto City, Kyoto (JP)

( * ) Notice: Subject to any disclaimer, the term of this patent is extended or adjusted under 35 U.S.C. 154(b) by 488 days.

(21) Appl. No.: 10/387,520

(22) Filed: Mar. 14, 2003

(65) Prior Publication Data
US 2004/0042293 A1    Mar. 4, 2004

(30) Foreign Application Priority Data
Mar. 18, 2002   (JP)  ............................... 2002-074529

(51) Int. Cl.
*G06F 11/00*   (2006.01)
(52) U.S. Cl. .......................... 714/8; 365/200; 365/201; 365/230.01
(58) Field of Classification Search .................... None
See application file for complete search history.

(56) References Cited

U.S. PATENT DOCUMENTS

| | | | | |
|---|---|---|---|---|
| 4,479,214 | A * | 10/1984 | Ryan | 714/702 |
| 5,502,729 | A * | 3/1996 | Nakata | 714/728 |
| 5,528,553 | A * | 6/1996 | Saxena | 365/230.01 |
| 5,537,631 | A * | 7/1996 | Wong et al. | 714/7 |
| 5,758,056 | A * | 5/1998 | Barr | 714/7 |
| 6,067,262 | A * | 5/2000 | Irrinki et al. | 365/201 |
| 6,308,293 | B1 * | 10/2001 | Shimono | 714/741 |
| 6,404,683 | B1 * | 6/2002 | Yumoto | 365/200 |
| 6,442,085 | B1 * | 8/2002 | Fragano et al. | 365/201 |

OTHER PUBLICATIONS

Kawamoto et al., Session XVIII: 256K/1 Mb DRAMs—II, 1984 IEEE International Solid-State Circuits Conference pp. 276-277.
Yamaoka et al, "A system LSI memory redundancy technique using an ie-Flash (inverse-gate-electrode flash) programming circuit", 2001 Symposium on VLSI Circuits Digest of Technical Papers, pp. 71-72.

* cited by examiner

Primary Examiner—Robert Beausoliel
Assistant Examiner—Philip Guyton
(74) Attorney, Agent, or Firm—Oliff & Berridge, PLC

(57) ABSTRACT

A memory section includes an array of a plurality of memory elements, an address selecting circuit, a data selecting circuit having a data writing section for being driven for writing or reading normal data or test data, and a data reading section for generating an output to represent a positive and a negative of a read value of stored data from the memory elements. A memory controlling section includes a computing means for inputting/outputting, computing, storing, or controlling data and control information, a nonvolatile defect-and-fault recovery table used for holding an inherent history of a semiconductor memory, registering a detected defect or fault, and mapping the memory element by the unit of address or by the unit of data selection path of the memory element to a registered alternative address or data selection path, and a controlling and storing means for storing data, information for control or test, or a processing procedure.

3 Claims, 20 Drawing Sheets

Sense amplifier 6-1-1-2

Operation waveform at data line BL, ¬BL

Symmetrical current mirror sense amplifier

Bipolar differential sense amplifier

SEMICONDUCTOR MEMORY AND METHOD OF TESTING THE SAME

TECHNICAL FIELD

The present invention relates to the technical field of semiconductor memories, and relates to a semiconductor memory that, for testing and recovering a detect or a fault in the memory, separately detects a malfunction or a fault in a storage mechanism of the memory element itself and a malfunction or a fault in a reading means, and registers or updates a location or a read path in which the fault occurs so that it is mapped to a new location for the recovery.

BACKGROUND ART

In conventional semiconductor memories, as common subject to integrated circuits, the wider the scale of semiconductor memories, the higher the rate of the defect occurs, the longer time required for testing is, or the larger the tester for the memories. Therefore, it is necessary to provide a test method and additional test circuits capable of efficiently in a short time. Moreover, it is important to develop a test method with a small scale of the additional circuits to be small and a recover method in which a recovery of the detected defect can be performed with ease and a few resources.

As a result, it is important to satisfy the following requirements in order to realize a mass semiconductor memory:
(1) a construction for an easy test;
(2) a high rate and simple test method; and
(3) a small additional test circuit, and a recover with a few resources.

Conventional test method of semiconductor memories is performed in such a manner that random data are supplied from outside and testing is carried out by all the combinations thereof, however, a large tester and a long test time are required to supply all patterns from outside, read and write the patterns from outside, and analyze the results thereof.

Current major test methods for mass semiconductor memories are as follows:
(a) a simple static test method, and
(b) a close dynamic test method.

By combining these methods, firstly, (a) as an initial simple sort method, recoverable memories are recovered by the evaluation of the test results detecting malfunctions by "reading '0' incorrectly in spite of writing '1' statically" or "reading '1' incorrectly in spite of writing '0' statically"; secondary, (b) memories determined as good in the initial test and recovery are exhaustively tested and sorted, and recoverable memories are recovered. As a result, all memories are tested and sorted.

Thus, current mass semiconductor memories usually incorporate the additional test circuits necessary for simple and minimum test. This is referred as "built-in self-test" in general, and this technique is disclosed in U.S. Pat. No. 5,999,464: "SEMICONDUCTOR MEMORY DEVICE AND METHOD OF CHECKING SAME FOR DEFECT", for example.

In the above-mentioned simple test for initially sorting semiconductor memories, the necessary condition is a set of:
(i) a construction for an easy test, and
(ii) a simple test method.

Generally, in the construction for easy test in the semiconductor memory, there are a normal mode in which the memory operates as a normal memory and a test mode in which the memory is tested, the test mode also has a basic self-test and a test from outside. In any cases, in order to perform the quick and precise test of the memory, it is necessary to provide a test circuit suitable for these tests or an additional test circuit in aid of the test on the integrated circuit. In addition, the self-test has an advantageous feature in that the test can be performed distributedly and independently of one another in an integrated circuit in a short time, and a plurality of semiconductor memories can be tested distributedly in parallel.

Generally, in testing of the fault in the memory, there are a sequential method and a batch method. In the sequential method, data and addresses are supplied from outside or are self-generated inside for testing every operation in the integrated circuit, and the faults accompanying write and read operations are detected. For a simple test performed mainly in the integrated circuit, if a defect or a fault is detected in the test, the test is stopped at the location where the detect or the fault is detected, and the selected path of the address or the data where the defect or the fault is detected is informed, whereas, if no defect or the fault is detected in the data, a next address is set and a series of test is repeated. In the batch method, all the test data are written at one time, after then, all of them are read, and all of the locations where the defects or the faults are detected are collected and processed, so that the address or selection path are recovered in a unit.

A conventional method of recovering the defect of the semiconductor memory is performed in such a manner that the defect location, an address containing the location, or a selection path of the data is cut off by a fuse, an electronic means, or a mechanical means, and is diverted to a location prepared as a reserve. Other examples of the method include:
an electrical cut-off by an EEPROM, a PROM, or a flash memory; and
an cut-off by a laser beam machining.

In a conventional construction considering the defect recovery of the semiconductor memory, also, in order to recover the memory optimally with the above-mentioned recovery method, various attempts are made in switching of defect locations and arrangements, and after defect locations are cut off, reserved locations are connected thereto. As an example of the method of switching connection with the use of circuits, there is a method in which an address is assigned over two addresses or a data line is wired over the selection path of two data lines, and if a defect is detected, switching is carried out from that location as a boundary to shift to the next, for example, as described in M. Yamada, etc: "A system LSI memory redundancy technique using, an ie-Flash (inverse-gate-electrode flash) programming circuit", Symp. On VLSI Circuits, pp. 71–72. June 2001.

Generally, in the integrated circuit, if a signal is taken outside, the power consumption increases and operating rate decreases in comparison with internal processing thereof, a loss increases of the power consumption from several times to several tens of times; thus, it is prefer to perform the internal process if possible. In testing, similarly, in the test method for sorting semiconductor memories at first, a simple and effective test method with built-in test circuits is widely used. For this reason, a little addition of incorporated test circuits is negligible for the mass memory.

In addition, a conventional semiconductor memory is manufactured in such a way that the written data are read as the written values. However, U.S. Pat. No. 6,205,047: "DATA MEMORY DEVICE HAVING AN EXCLUSIVE- OR FUNCTION AND METHOD OF READING DATA THEREFROM" proposes a method of performing an exclusive-OR operation to read the stored content by reading the stored content positively or negatively with the control by retrieval data for retrieving identity, and thus, it is possible to detect a mismatch between the stored content and the test data when they do not match to each other.

Nevertheless, current major methods of testing faults use a round robin method in which a test pattern capable of detecting all faults is compared with the result obtained by storing and reading the test pattern. These methods require $O(N^2)$ times of tests where the number of memory elements is N, that is, tests are required over an exponential number of times, and thus, a subject in the mass memory is how read and write tests of all these combinations should be performed in a short time or in a few number of times of tests.

Therefore, the test items for sorting the product of the memory at first is limited to a stuck-at-1 fault, by which the variant of a logic function is always fixed to 1, or a stuck-at-0 fault, by which it is fixed to 0.

The test is performed by a method of testing the semiconductor memory at a high speed by providing an additional test circuit in the memory, and by a method of testing the memory in a short time or at a small number of times of comparison.

It should be noted that the precise test is not performed in the present invention, however, the semiconductor memory that incorporates minimum additional circuits according to the present invention may be tested by cooperating with an external tester and comparing the memory with the specification thereof, as required.

DISCLOSURE OF THE INVENTION

In order to:
(1) test the memory inside as much as possible,
(2) employ a construction with a few additional test circuits,
(3) eliminate particular reserve memory elements, and
(4) recover the defects and faults with a few resources when performing a simple test for sorting the semiconductor memories at first.

The object of the present invention is to provide the construction of the memory, the method of testing the memory, and the method of recovering the memory wherein the test content is limited to the simple test of the stuck-at-1 faults and the stuck-at-0 faults, preferably, an additional test circuit is incorporated to shorten the test time and the additional test circuit itself is constructed with a few elements so that these faults are distinguished from error reading in reading systems, and the test of the memory is performed with a few times of comparison and with a small comparison circuit and the recover of the memory is performed with a few resources, for example.

In order to achieve the mass semiconductor memory with a large-scale integrated circuit technology, it is necessary to realize:
(I) the recovery of defects or faults occurring exponentially in accordance with the increase of the scale, and
(II) the memory construction suitable for the purpose of the use; and it is important to have these functions. When developing the large-scale semiconductor memories, aiming at performing the test and the recovery such that defects or faults occurring exponentially according to the scale are tested and recovered in efficiently, it is essential to construct the semiconductor memory in such a manner that it is interrelated with system architectures including an OS and the component elements thereof, and to achieve high testability and recoverability under such an environment.

The present invention concerns with, as described above, a construction in which the semiconductor memory is compliant with other devices or systems, and a construction that makes it possible to test and recover defects or faults, which is indispensable to further increase the scale thereof, as well as a test method thereof, an additional test circuit thereof, and a recovery method thereof, and with achieving a large scale and mass semiconductor memory for an easy recovery.

In accordance with the first aspect of the present invention, the present invention provides a method of testing a semiconductor memory characterized in that, for testing a defect or a fault in the semiconductor memory, one or a plurality of addresses are either supplied externally, or generated internally, to one or a plurality of memory elements that constitute the semiconductor memory, test data are written into the memory element(s) corresponding to the address(es), the test data having a pattern including a logical value "1", "0", or any combinations thereof that are either supplied externally or generated internally, and the written data are read out and compared with the test data to obtain a match or a mismatch therebetween, whereby a stuck-at-0 fault or a stuck-at-1 fault is detected.

In general, memories are devices storing data in the form of physical quantity of charge or magnetism, and in which write and read operations for the stored data are performed, normally, the written data can be reproduced as read data in the same form as illustrated in Table 1, which shows that when "0" is written, "0" is stored, and "0" is read as a stored content, or when "1" is written, "1" is stored, and "1" is read as a stored content.

TABLE 1

| Method of reading memory-1 | | |
|---|---|---|
| Written Data | Stored Data | Read Data |
| 0 | 0 | 0 |
| 1 | 1 | 1 |

Another operation is performed in such a manner that, as shown in Table 2, when "0" is written, "0" is stored, but "1" is read as a stored content, or when "1" is written, "1" is stored, but "0" is read as a stored content.

TABLE 2

| Method of reading memory-2 | | |
|---|---|---|
| Written Data | Stored Data | Read Data |
| 0 | 0 | 1 |
| 1 | 1 | 0 |

When testing of the fault of this memory, first, in order to check if the operation of the memory element as shown in Table 1 is correct, it is judged to have the defect or the fault in the case where "'0' has been stored statically, but it changes into '1' when reading", or "'1' has been stored statically, but it changes into '0' when reading". On the other hand, in Table 2, it is judged to have the defect or the fault in cases where data abnormality is detected such that "'1' has been stored, but it remains '1' though it is read negatively", or "'0' has been stored, but it remains '0' though it is read negatively".

In general, the testing of the fault is carried out by repeating a series of the following operations; statically or dynamically prepared test data are sequentially increased or decreased, and they are written, read, and tested, until a fault is detected and the process is suspended or the above-mentioned series of the operation are terminated.

In this detection of the fault, it is necessary to compare the written test data with the results obtained by reading the stored data, as described above, and this is generally performed by providing a comparator. However, in the present invention, in order to perform testing more efficiently, this is performed by a positive or a negative reading with reference to test data, as shown in Table 3 (hereafter, a logical NOT is represented by "¬".).

TABLE 3

Stored test data values and their positive and negative read test

| Test data | Stored value | Sense amplifier output | | Operation result (c) | Diagnosis result |
|---|---|---|---|---|---|
| (a) | (b) | D | ¬D | EXOR (a, b) | (1:fault) |
| 0 | 0 | 0 | 1 | 0 | 0 |
| 0 | 1 | 1 | 0 | 1 | 1 |
| 1 | 0 | 0 | 1 | 1 | 1 |
| 1 | 1 | 1 | 0 | 0 | 0 |

The detection of the fault observed from outside includes detection of the faults in data reading systems, and in order to detect such faults in the reading systems, the cross-coupling type amplifier of the sense amplifier in the reading means consists of a pair of positive and negative transistors. The faults in these transistors are detected by EXOR or AND (1, 1)+NOR (0, 0) of a pair of the sense amplifier outputs.

It is possible to separate the faults of the memory elements as shown in Table 3 from those in the data reading systems (including dummy elements) by analyzing the faults after they have been detected, and those result from the faults in the memory elements are restricted to faults of individual memory elements, whereas those result from the data reading systems (including dummy elements) extend to those of all the data lines.

In the simple fault test as described above, if the number of defects or faults and recovered locations of those determined as defective is within a predetermined range, they are registered, and the locations or regions containing the defects or faults are recovered in a unit of address or data selection path.

On the other hand, strictly speaking, the operation of the circuit containing the defect or the fault is unstable, and for this reason, such a circuit tends to be determined as defective products due to the defect or the fault in the transitional operating conditions in which dynamic voltage, current, storage time, and various items do not satisfy predetermined conditions. Such a complicated fault is usually caused by, for example, deterioration in transistors and capacitors, various noises and voltage power supply fluctuations, and a lack of the margin in the operating temperature thereof.

For the procedure of such fault test and defect recovery, there are generally two methods; one is a method in which those determined as good in a simple test are tested precisely, and if the defect or the fault is detected, the defect or the fault is recovered, and the other is a method in which, of those determined as defective in the simple test, those having a small number or locations of the defects or the faults are recovered by a precision test.

If the number of any one of the faults and the defect or recovered locations in the former (those determined as good in the simple test but detected in the precision test) is within a predetermined range, they are recovered by registering or updating in the defect-and-fault recovery table.

On the other hand, in a process which is good for the yield of the products, a large number of the products are determined as good in the simple test. In this case, by the latter method, the products are sorted in the simple test, and the products with a small number of the defects or the defect locations are then tested precisely and recovered.

In accordance with a second aspect of the present invention, the method as set forth in the first aspect is characterized in that, for testing a defect or a fault in the semiconductor memory, means for reading out the written data is configured so as to generate a pair of complementary outputs including a positive and a negative of the read value during normal operation, and if a match is detected between the pair of complementary outputs, it is determined that the data reading means has a defect or a fault.

When the operation of the semiconductor memory is tested with the limited information obtained from outside, the information appears entirely in the outputs from the sense amplifier in the data reading means. Therefore, when testing the semiconductor memory, it is important to observe the operation of the sense amplifier in the data reading means, and it is also important to add the faults of the sense amplifier (a pair of transistors) itself to the test items, which faults cannot be detected only by the read test of the memory elements.

In accordance with a third aspect of the present invention, the invention provides a method of recovering a defect in a semiconductor memory, using the method of testing according to the first aspect, wherein, for recovering a defect or a fault in the semiconductor memory, a nonvolatile defect-and-fault recovery table holding an intrinsic history is provided, and one or a plurality of locations or regions having the defect or the fault is/are registered or updated therein in a unit of address or in a unit of data selection path, and they are mapped to other normal address(es) or data selection path(s) that are registered or updated, whereby the one or the plurality of locations or regions having the defect or the fault is recovered.

Conventionally, when recovering the defect or the fault in the semiconductor memory, the location containing the defect or the fault is cut off by the fuse, the electric means, or the mechanical means, and a reserved region provided for the recovery is connected thereto by a similar means and set in a unit of address or data selection path. Thereby, the defect or the fault is recovered.

According to the present invention, mapping with the defect-and-fault recovery table is performed. In this case, the location or the region where the defect or the fault is detected is registered or updated, or the address or the data selection path containing the location where the defect or the fault is detected is registered or updated as a unit. Then a designated address or data selection path is checked against the address or data selection path that has been registered in advance, and if it has been registered, mapping is carried out so that the defect or fault location is not used for storage.

In accordance with a fourth aspect of the present invention, the invention provides a method of recovering a defect in a semiconductor memory, using the method of testing according to the first aspect, wherein, for recovering a defect or a fault in the semiconductor memory, types of selection of the memory element(s) are categorized into three types, being "write", "read", and "not-selected", so that one or a plurality of memory elements having a defect or a fault is/are not selected.

Since selection of the memory elements is made by a read operation and a write operation, "not-selected" is provided in the types of selections in addition to "write" and "read", and even if an attempt is made to select the locations at which defects or faults occur, the locations are not used for storage and other locations are assigned for recovery.

In accordance with a fifth aspect of the present invention, the invention provides a semiconductor memory comprises:

A. a memory section including:
(a) a memory element array comprising a plurality of memory elements;
(b) address selecting means for selecting the memory elements according to one or a plurality of normal addresses supplied externally or according to one or a plurality of test addresses supplied externally or generated internally; and
(c) data selecting means having data writing means for being driven for writing or reading one or a plurality of externally supplied normal data, or externally or internally generated test data, and data reading means having a complementary output section for reading stored data from the memory elements with a positive logic or a negative logic and for generating a pair of complementary outputs including a positive and a negative of the read value; and B. a memory controlling section including:
(d) computing means capable of performing inputting/outputting, computing, storing, and controlling, of data and control information;
(e) a nonvolatile defect-and-fault recovery table for holding an inherent history of the semiconductor memory and for registering or updating one or a plurality of defects or faults according to a test result in a unit of address or in a unit of data selection path and alternative address(es) or alternative data selection path(s) with the units, the table being referred to for mapping; and
(f) controlling and storing means for storing data, control or test information, or processing procedure thereof;

C. wherein the memory element array is tested by designating one or a plurality of externally or internally generated test addresses, writing and reading externally or internally generated test data, and comparing the test data with the original test data, whereby a defect or a fault related to the one or the plurality of memory elements and the data reading means is detected, and with processing by an internal or external computing means, an address or a data selection path containing the defect or fault is registered or updated in the unit of address or in the unit of data selection path in the defect-and-fault recovery table so that the number thereof is minimized on the whole, and a location or region of the defect or the fault is mapped to an alternative location or region, whereby the location or region of the defect or the fault is recovered.

A semiconductor memory has two operation modes:
a normal operation mode, and
a test operation mode.

The normal operation mode is typically such that communication is made with an external device, and writing, storing, and reading of the data are performed. The test operation mode includes a test operation and a recovery operation. In this test mode, addresses and test data generated externally or internally are written, stored, and read to perform a test in which the read values are compared with expected test values (test data), and the results are analyzed and processed so that recovery is made with the least amount of resources.

A write operation of the normal operation mode is as follows. According to the communication procedure of the write instruction supplied externally, one or a plurality of addresses and data supplied externally are temporarily stored in the controlling and storing means under the control of the computing means, and a provisional writing is completed and the notification is made. Thereafter, they are converted into the addresses or data selection paths that are actually to be written within a predetermined time referring to the defect-and-fault recovery table, or the foregoing conversion is carried out immediately and writing is completed, after which the notification is made.

A read operation of the normal operation mode is as follows. According to the read instruction supplied from an external device, one or a plurality of addresses are converted to the addresses or data selection paths that are actually read out referring to the defect-and-fault recovery table, and reading is performed. Data are temporarily stored in the controlling and storing means and are put into blocks to be read out, or the foregoing conversion is immediately carried out and reading is performed. The temporary storing in the controlling and storing means in reading and writing is to control and relax the asymmetry in terms of time between writing and reading.

The objective of the test mode is to detect a defect or a fault and notify outside, or to analyze and recover the fault. Thus, according to a test instruction supplied from an external device, addresses are directly generated by the test address generating means under the control of the computing means, and test data are prepared and written by the test data generating means, or test data that are prepared in a similar manner referring to the defect-and-fault recovery table except the locations that have already been detected, are written and stored. Then, by reading out the stored contents, the test data are compared with the stored contents so that a match or mismatch is detected, and further a match or mismatch between a pair of a positive and a negative complementary outputs is detected, to detect defects and faults in the memory elements and the reading means.

The recovery in the test mode is as follows. In the computing means, from the distribution of the defect and fault locations detected by the test, the defects and faults of the memory element and the reading means are analyzed and processed, and a recovery in a unit of address and a recovery in a unit of data selection path are combined so that the recovery can be made with the least amount of resources. They are then registered or updated in the defect recovery table.

In recent years, in order to achieve a large-scale semiconductor memory having a configuration compliant with computers, their OSs, or their software, it has been necessary not only to cram a large number of memory elements into one integrated circuit but also to obtain a computable storing and controlling means that can (1) establish communication methods with outside, (2) set a unit of reading and writing, (3) recover defects during the manufacturing process, and (4) recover faults in normal use. Incorporating such means causes the area occupied by such a means to increase in the memory capacity as the capacity of memory increases, and the overhead caused by the memory control operation also increases. However, even if such a small decrease in the memory capacity and the increase in the overhead are taken into consideration, it has been recognized that the problems in the scale increase and in mass-production technology that are caused by not incorporating such means become far larger obstacles.

In accordance with a sixth aspect of the present invention, a semiconductor memory as set forth in the fifth aspect is provided in which a fault in the data reading means is detected by a match between a pair of a positive and a negative complementary outputs obtained from the data reading means.

A cross-coupling type sense amplifier that constitutes the data reading means has a voltage latch type flip-flop construction composed of a pair of transistors that generate positive and negative complementary outputs. The amplifying operation is stable when one of them is ON and the other is OFF. Therefore, when both are ON or both are OFF, that means the sense amplifier itself has a fault. Accordingly, this condition needs to be detected in addition to the fault test of the data storage mechanism.

These are summarized in Table 4 below, and thus all the faults can be detected by a pair of positive and negative outputs from the sense amplifier of the data reading means.

TABLE 4

| Test | | Sense amplifier output | | | Operation result | Diagnosis result |
|---|---|---|---|---|---|---|
| Test data | Stored value | D | ¬D | ¬EXOR | EXOR | (1:fault) |
| X | X | 0 | 0 | 1 | −(0) *1 | 1 |
| 0 | 0 | 0 | 1 | 0 | 0 | 0 |
| 0 | 1 | 1 | 0 | 0 | 1 | 1 |
| 1 | 0 | 0 | 1 | 0 | 1 | 1 |
| 1 | 1 | 1 | 0 | 0 | 0 | 0 |
| X | X | 1 | 1 | 1 | −(0) *2 | 1 |

Note:
*1 and *2 means that whatever the test data and the stored values may be, the outputs D and ¬D become (0, 0) or (1, 1) as the result of the fault in the sense amplifier.

It will be apparent that the method of data reading of this memory is widely applicable, taking into consideration the fact that the sense amplifier of the data reading means can be applied to reading of the multi-value memory elements.

In defects or faults of the semiconductor memory, there are initial faults and aged faults, and the faults are caused even while it is being used. Generally, the defects or faults detected during the manufacturing process are recovered, but those occurring during normal use processes are considered difficult to recover. However, when the frequency of defect or fault occurrences during the use processes is high, for example, when used in aerospace instruments that are exposed to high temperatures and radiations and in an environment in which heat cycles of high and low temperatures are repeated, there is always a risk of fault occurrences, so in such cases, it is necessary that defects or faults are registered or updated and the recovery is made flexibly.

In the defect-and-fault recovery table that makes such a recovery possible, the history and the defect or fault recovery information intrinsic to a semiconductor memory are stored, and it is made of a nonvolatile memory or a nondestructive and nonvolatile memory, or a memory in which the information that has been backed up in advance is written and used. And, at least one of the following systems is prepared for the table. One is such that the addresses or data selection paths containing defects or faults as well as the addresses or data selection paths prepared as the destinations of mapping (address conversion or the like) from the defective addresses or the like are registered therein, and therefore, the addresses etc. registered as defects etc. are read out by the computing means and mapped. The other is such that it is an associative memory in which when a defective address or the like is designated, its mapped address or data selection path can be directly read out from the defective address or the like.

The methods of cutting off the memory elements using the recovery table system includes the following two methods, depending on the distribution state of defects or faults including the read paths and depending on the selection method:

(1) a method of cutting off in a unit of address, and (2) a method of cutting off in a unit of data selection path.

Generally, it is necessary that these be combined so that the recovery is efficiently made with fewer resources. In the former, the recovery is performed in such a manner that the addresses containing the defects or faults are isolated and switched to alternative addresses, whereas in the latter, the recovery is performed such that, in cases where defects or faults are distributed over a plurality of addresses, the data selection path is isolated and an alternative data selection path is assigned.

In addition, as for the recovery in a unit of data selection path, since major causes of the faults are due to the sense amplifier or selecting lines of the data reading means, the recovery can be sufficiently performed by a conventional technique of cutting off by a fuse or a laser or cutting off by an electric means so as to switch and connect to another data selection path in cases where it has the same level of reliability as other peripheral circuits; therefore, this technique may be used together with the method of the invention of the present application to perform the recovery efficiently.

On the other hand, the system in which dummy cells are used for the reading means, it is necessary to recover faults in the dummy cells that can occur during use since the dummy cells also have the same configuration as the memory elements.

In accordance with a seventh aspect of the present invention, a semiconductor memory as set forth in the fifth aspect is provided in which, for recovering a defect or a fault in the semiconductor memory, types of selection of the memory element(s) are categorized into three types being "write", "read", and "not-selected" so that one or a plurality of memory elements having a defect or a fault is/are not selected.

Normally, operations of the memory elements are a write operation, a retention of memory, and a read operation. Of these, Table 5 below shows the modes of selecting three states, namely, "write", "read", and "neither write nor read is performed (not selected)", by selecting a gate potential $\phi 0$ of write input transistors Tr1, Tr2 to the data writing means and a gate potential $\phi 1$ of read output transistors Tr3, Tr4 from the data reading means. The configuration of this selecting circuit is realized, for example, as shown in FIGS. 8 to 11. In order to reduce power consumption or avoid short circuits accompanied by the faults, it is necessary at times that the power supplies are individually cut off or are collectively cut off in a unit of address or in a unit of data selection path.

TABLE 5

Selection of three operations

| Function | Switch | | | |
|---|---|---|---|---|
| | Tr1 (φ0) | Tr2 (φ0) | Tr3 (φ1) | Tr4 (φ1) |
| Write | 1 | 1 | 0 | 0 |
| Read | 0 | 0 | 1 | 1 |
| Not selected | 0 | 0 | 0 | 0 |

Normally, in these operations of the semiconductor memory, the nonvolatile memory elements are in a stand-by state and are cut off as floating when they are not accessed. In addition, since DRAM is a volatile memory, it has to be connected and refreshed regularly. Further, since SRAM stores memory utilizing two stable states of flip-flop for the memory elements, it consumes electric power even in a stand-by state.

In view of these, to stop the function of passive memory elements, the memory elements should be maintained in the third state, which is "not-selected" regardless of it being volatile or nonvolatile. In order to stop the memory elements of SRAM composed of active circuits, it should be maintained in the third state, which is "not-selected" but it is also necessary to cut off the power supply so as to reduce power and avoid adverse effects to other elements.

In accordance with an eighth aspect of the present invention, a semiconductor memory as set forth in the fifth aspect is provided in which, in the memory controlling section, the controlling and storing means for storing various information and process procedures performs, in addition to the storing, temporary storing of data or storing for temporary processing of data, so that asymmetry in terms of time between a write operation and a read operation of the memory element(s) is relaxed to attain a high-speed operation.

In the test of the memory, the controlling and storing means for storing various information controlled by the computing means is provided in the memory controlling section. Thereby, programs, test data, and test results are stored therein so that the test results can be analyzed, and the information that is normally accessed singly or in a unit of page is temporarily stored therein to serve as a buffer for reading and writing.

In addition, there is an error correcting code (ECC) as a higher concept of defect or fault recovery method, and coding that uses the computing means and the controlling and storing means is also an important method.

On the other hand, if this is considered as a system's component element, it is desirable that the information necessary for a computer should be quickly read, and that when writing to the memory, transfer should be quickly performed and the connection should be released. Consequently, those which can be temporarily stored are received at the memory controlling section by using a temporary write method, or those which can be read by nondestructive reading are by using a method of nondestructive reading and temporary writing, whereafter they are written at a predetermined time. Thus, high-speed operation is achieved on the whole.

These functions of the memory controlling section are selectively used under the condition in which it is connected to an external computing means or digital apparatus. In addition, its configuration, OS, and software are different between general-purpose systems and dedicated systems, and they are determined according to where is appropriate for placing those functions.

BEST MODE FOR CARRYING OUT THE INVENTION

Figure 1:
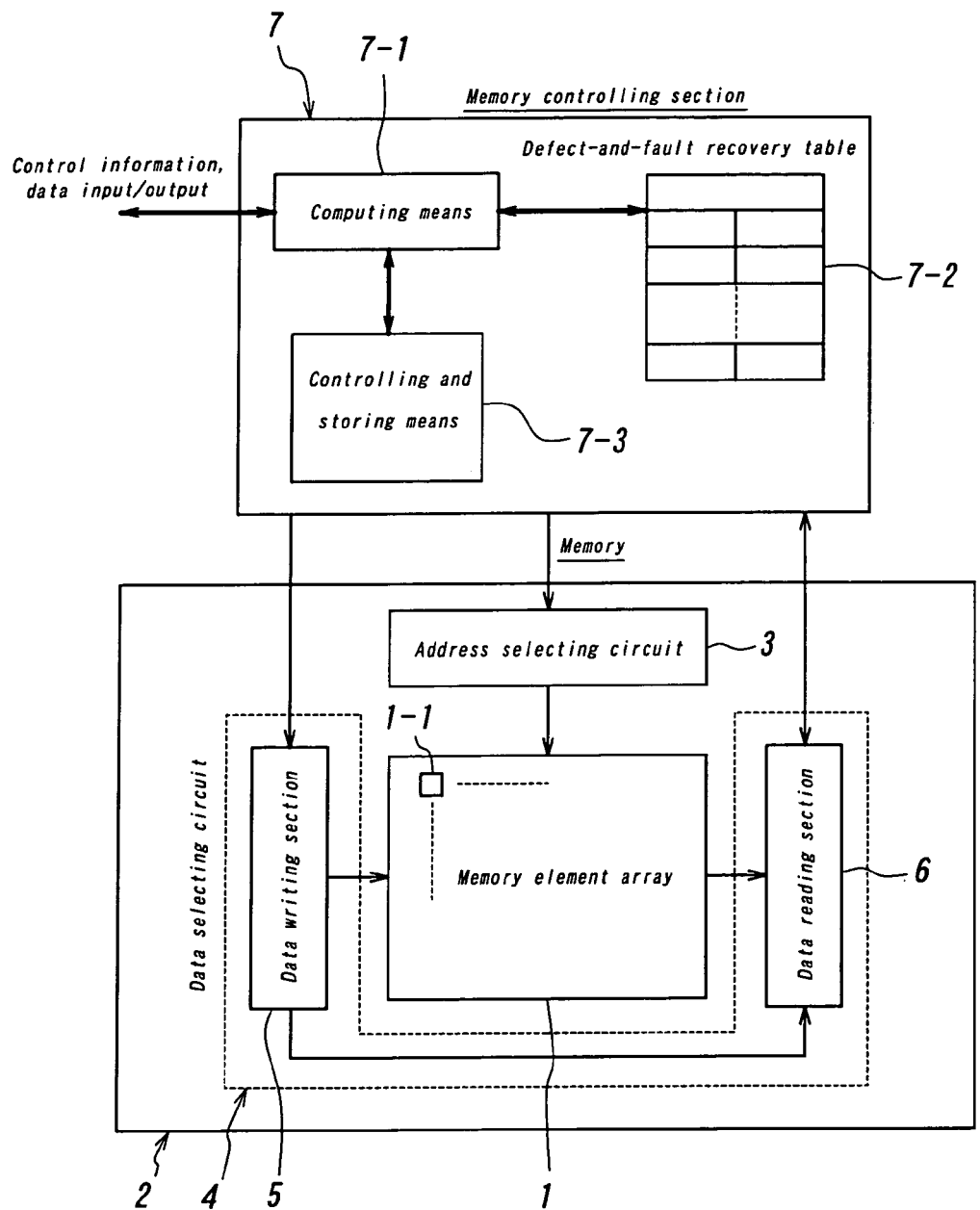
FIG. 1 is a block diagram showing the embodiment of the semiconductor memory according to the present invention.

At first, the embodiments of the method of testing a semiconductor memory and the method of recovering the defect in the semiconductor memory according to the present invention will be described with reference to the drawings, and then, the embodiments of the semiconductor memory according to the present invention will be described with reference to the drawings. It should be noted that, in the drawings, same elements are designated by same reference characters, and in FIGS. 8 to 11, pre-charge and pre-current drive mechanisms are not shown for the sake of simplicity of illustration. Likewise, as for a unit of recovery, the recovery in a unit of address is mainly discussed here, and detailed internal operations thereof are given only about DRAM, which is a typical semiconductor memory, as others will be inferred therefrom and therefore will be described only about their primary portions.

FIG. 1 shows the embodiment of a construction of the semiconductor memory capable of being integrated in a large-scale in consideration of the test of the semiconductor memory and a recovery of the defect and the fault detected by the test. In FIG. 1, a memory 2 comprises a memory element array 1 with a plurality of memory elements 1-1, an address selecting circuit 3 for selecting these elements, and a data selecting circuit 4 with a data writing section 5 and a data reading section 6. A memory controlling section 7 controlling the memory 2 for normal use as well as for testing, a defect recovery, or the like has a computing means 7-1, a defect-and-fault recovery table 7-2, and a controlling and storing means 7-3. The memory controlling section 7 capable of computing tests, registers, and manages the recovery of the defect or the fault of the semiconductor memory. The memory controlling section 7 also maps the defect or fault locations to other locations and stops the operation thereof so that the defect or fault locations are not selected. It should be noted that, in a ultra large-scale memory, the area occupied by the memory controlling section in the overall area is relatively small, the recovery of the defect or the fault is closely related to an OS, and in a system performing a paging which requires continuous regions, the access is performed assuming that no defect or fault exists. Therefore, in the semiconductor memory, the recovery is performed locally.

As described above, the semiconductor memory according to the present invention has two operation modes, namely, a normal operation mode and a test operation mode. That is, in the normal operation mode, the semiconductor memory communicates with an external device, and writing, storing, and reading of the data are performed. On the other hand, the test operation mode includes a test operation and a recovery operation. In the test operation, the writing, the storing and the reading are performed with addresses and test data generated externally or internally, the test is performed by comparing the stored data with the test data and the result of the test is analyzed in order to recover with a minimum resources.

In the writing operation of the normal operation mode, a write instruction supplied from an external device is controlled in accordance with a control procedure interpreted and determined by the computing means. Under the control of the control procedure, one or a plurality of addresses and data supplied externally are temporarily stored in the controlling and storing means 7-3, and thus a provisional writing is completed. After notifying of the completion of the provisional writing, within a predetermined period of time, the addresses are converted into addresses or data selection paths to be written actually with reference to the defect-and-fault recovery table 7-2, or the conversion is performed immediately and thus the completion of writing is notified.

In the read operation of the normal operation mode, according to the procedure determined by a read instruction supplied from the external device, one or a plurality of addresses are converted into addresses or data selection paths to be read actually with reference to the defect-and-fault recovery table 7-2, and the data are read from the selected memory elements and stored temporarily in the controlling and storing means 7-3. The data are then put into a block that is a transferable unit and sent to the external device, or the conversion is performed immediately so that the data are read and sent to the external device.

In the test mode, the writing, the storing and the reading of the test data to the memory is performed, the value read from the memory is compared with the test data in order to the defect or the fault, and the detection of the defect or the fault is transmitted to external or the defect or the fault is analyzed and recovered. In accordance with a procedure by a supplied test instruction, a test address generating means 3-3 generates addresses directly, a test data generating means 5-3 prepares dynamic or static test data and then writing of the test data is performed under the control of the external or internal computing means 7-1. At this time, the test address generating means 3-3 either generates all addresses to be tested by the control function of the computing means 7-1, or generates addresses except the locations that have already been detected as the defect or the fault in the defect-and-fault recovery table to which has been referred. The written test data are stored in the memory and are read by the data reading section 6 after a predetermined time. Then, the contents thereof are compared with the test data, and a match or mismatch is detected between a pair of complementary outputs composed of an affirmation and a negation from the data reading section 6.

Thereby, the defect or the fault in the memory element itself is detected by the match or the mismatch between the read data (usually, an affirmative read value) from the data reading section 6 and the test data, whereas the defect and the fault in the data reading section 6 is detected by detecting the match state of a pair of complementary outputs in the read data, which match state is originally non-existence, or the match or the mismatch between a pair of the complementary outputs of the affirmation and the negation of the reading means.

A recovery operation in the test mode is as follows. Using a recovery algorithm including the defect or the fault locations detected in the above-mentioned test mode and provided in the computing means, the defect and the fault in the memory element 1-1 and the data reading section 6 are analyzed from the distribution in the address space of the defect or the fault locations, processed so as to be recovered with the minimum resources by combining the recovery in a unit of address and that in a unit of data selection path, are registered or updated in the defect recovery table 7-2, and thus recovered.

Upon receiving the test result reporting the defect or the fault and recovering the semiconductor memory, the test result is temporarily placed in the computing means 7-1, the controlling and storing means 7-3, or the defect-and-fault recovery table 7-2. It is examined if all the memory elements 1-1 connected to a specific data selection path are destroyed or not, or if a pair of the complementary outputs of the data reading section 6 mismatch together or not. If the destruction of the memory or the match of the complementary outputs (the fault in the reading section) exists, then it is registered in the defect-and-fault recovery table 7-2 in a unit of the data selection path, and an alternative data selection path is assigned to recover it.

The rest of the defect or fault locations are processed and recovered in a unit of the address or the data selection path so that they are minimized. To perform such a process, a section of the table 7-2 storing the fault locations is searched using a memory element reading the controlling and storing means 7-3 or the defect-and-fault recovery table 7-2 affirmatively or negatively, and they are assigned so that the number of the addresses or the data selection paths in the fault locations are minimized, as described above. As such a memory element for the search, it is possible to adopt a part of the memory to be tested, which memory is determined to be usable as a result of the test according to the present invention.

Figure 2:
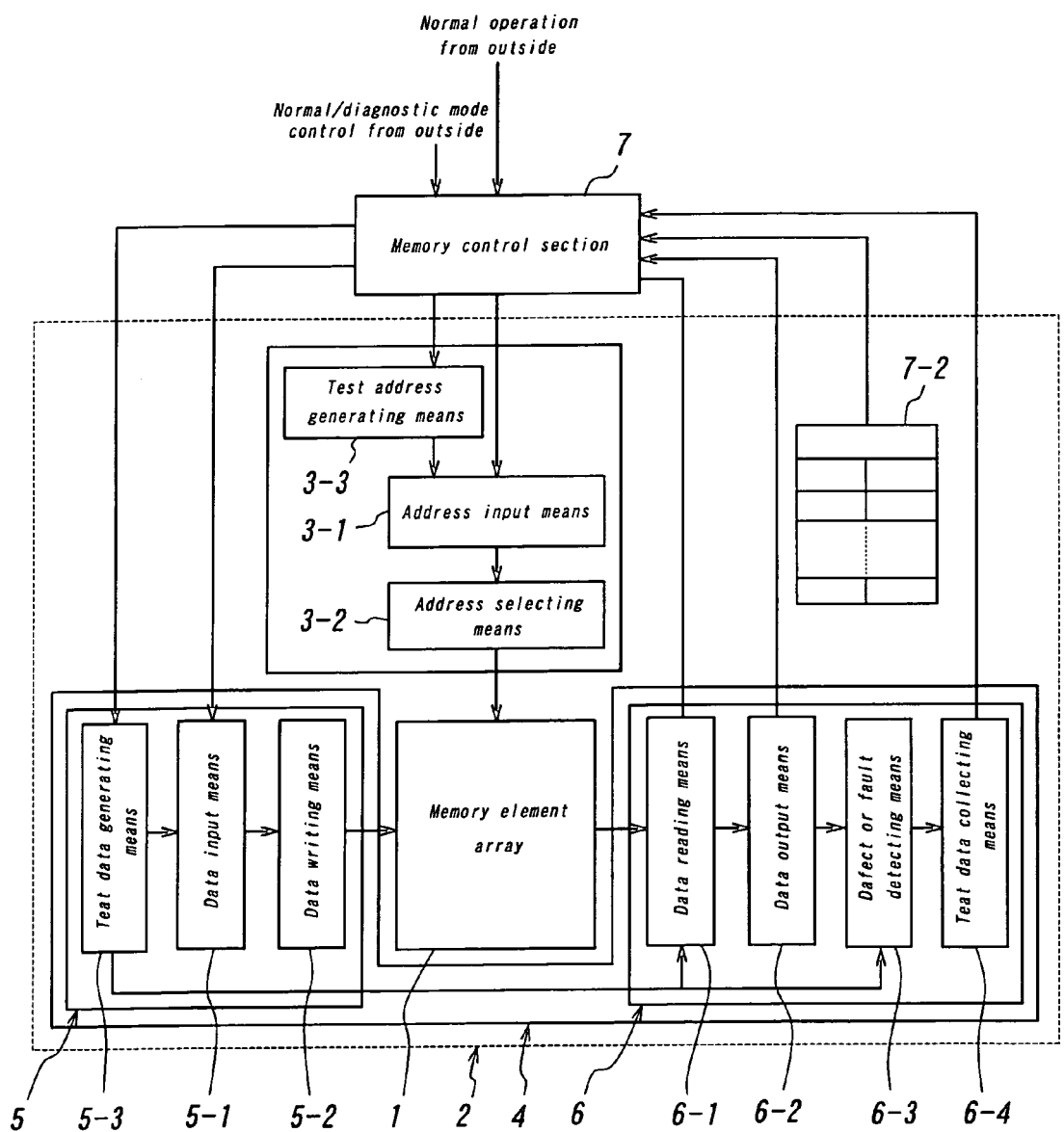
FIG. 2 is a block diagram showing an example of a self-test of the semiconductor memory according to the present invention.

FIG. 2 shows the embodiment of a construction of the semiconductor memory performing the self-test and a recovery therein. In the embodiment, a test address generating means 3-3, a test data generating means 5-3, and the defect-and-fault recovery table 7-2 are provided in an integrated circuit. When a test request is given, a test pattern of "1" or "0" determined statically or dynamically with random numbers is created in the test data-generating means 5-3, the address generated in the test address generating means 3-3 is designated, and a read and write test is performed. If the defect or the fault is found, the operation is stopped and the fault location or the fault region is temporarily stored in the computing means. Then, the address is added or subtracted by 1, and the foregoing test is repeated. On the other hand, if the result of the test is normal, the address is added or subtracted by 1 without the above processing, and the foregoing test is repeated. When the address reaches a predetermined end position, if the defect or the fault is found even in at least one address throughout the test, then the test ends the result of the test indicating that the defect or the fault is present, whereas if the test ends normally, then the process ends properly. The addresses or regions on which the defect or the fault is detected are registered in the defect-and-fault recovery table 7-2.

As another embodiment of the test method, it is possible to carry out a test method in which all the generated addresses and test patterns as described above are assigned and written into all of the memory elements, thereafter the stored values are read, and the read values are compared with the reserved test pattern.

The test of the embodiment concerns a method in which the stored contents are compared with reference to the test data and "are read affirmatively or negatively". In this case, the fact that a stored "1" has changed to "0" or that a stored "0" has changed to "1" is detected as the defect or the fault, and the information is stored temporarily in the controlling and storing means 7-3 in the memory controlling section 7, and then registered and updated in the nonvolatile defect-and-fault recovery table 7-2 so that the recovery can be carried out in the unit of the minimum or the optimum addresses or data selection paths.

In addition, it is possible to supply the test data from outside in this embodiment. It is also possible to supply the test data from outside, which test data being enough to test all of the abnormalities that can be detected, and to perform a precise test with the external tester so that the substantially perfect test and recovery can be carried out in cooperation with the above-described simple test.

In the embodiment shown in FIG. 2, it is possible to employ a feature in which the semiconductor memory is constructed only by the memory section. This is a feature in which the semiconductor memory is controlled from outside for the test and the recovery, and various constructions can be adopted in accordance with the way to distribute the test functions between the memory section and the external devices. The defect-and-fault recovery table 7-2 for holding the characteristic information about the semiconductor memory and the history of the defect or the fault in the semiconductor memory may be a simple non-volatile memory, a non-volatile and non-destructive memory, or a memory in which the information backed up in advance is read and held, and so on. The defect-and-fault table 7-2 may be placed outside or inside thereof. In a typical external control system, the defect-and-fault recovery table 7-2, the test address generating means 3-3, and the test data generating means 5-3 are provided outside thereof. In the normal use, the defect-and-fault recovery table 7-2 is managed in the tester or the computer in the system, and the external test equipment or the computer in the system performs the above-mentioned test for recovering. By using the external tester with high performance, the internal additional circuit for testing or recovering can be simplified and the test can be performed with consistency; however, the scale of the tester increases, whereas by using the computer in the system, the test and the recovery can be carried out in the simplest manner with consistency.

Figure 3A:
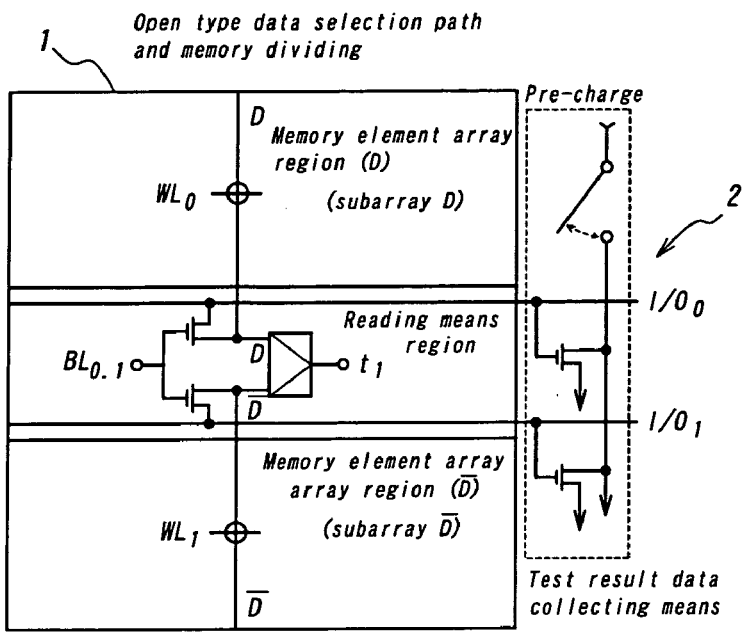
FIGS. 3a and 3b are views for showing the increase of the capacity and the element arrangement of the memory according to the prior art, in which FIG. 3a concerns with the open-type data selection path and the memory division and FIG. 3b concerns with the return-type data selection path and the memory division.
Figure 3B:
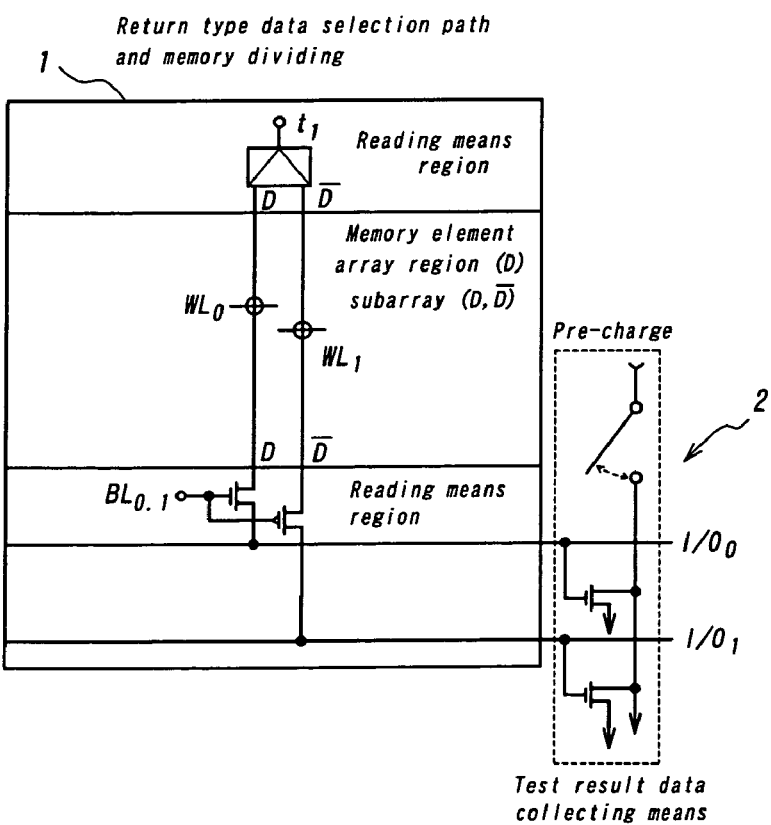

FIGS. 3*b* and 3*b* show an example of a public known model of the increase of the memory capacity and the memory element array. There are (a) an open type data line arrangement style and (b) a return type data line arrangement style in accordance with the configurations of the reading means and data selection lines thereof, and in both cases, the mass memory element array 1 is arranged by a plurality of separate sub-arrays.

In relation to the construction of the read data selection path and the reading means (the sense amplifier), the memory elements are arranged with separate partial arrays (sub-arrays) in order to achieve the split decoding of the address, the uniformity of the read/write delay and the localization of the fault or the defect recovery, which are required in accordance with the increase of the memory capacity. In this case, as will be described later with reference to FIG. 11, the reading means is provided with data selection paths at both terminals (D,¬D) and an equalization process of the stray capacitance is performed to attain the uniformity of the read/write delay and the correction of the reading means, and the reduction of the space thereof. As an example of a structure in which the memory element array is divided and the reading means are shared, there is a shared amplifier, which is proposed by S. S. Eaton et al.: "A 100 ns 64K Dynamic RAM Using Redundancy Techniques", ISSCC81, Dig. Tech. Papers, pp. 84 85, February 1981. In this structure, each data selection path is connected to a plurality of memory elements, or a plurality of memory elements and a single dummy cell, and one single reading means serves to read a plurality of addresses.

Figure 4:
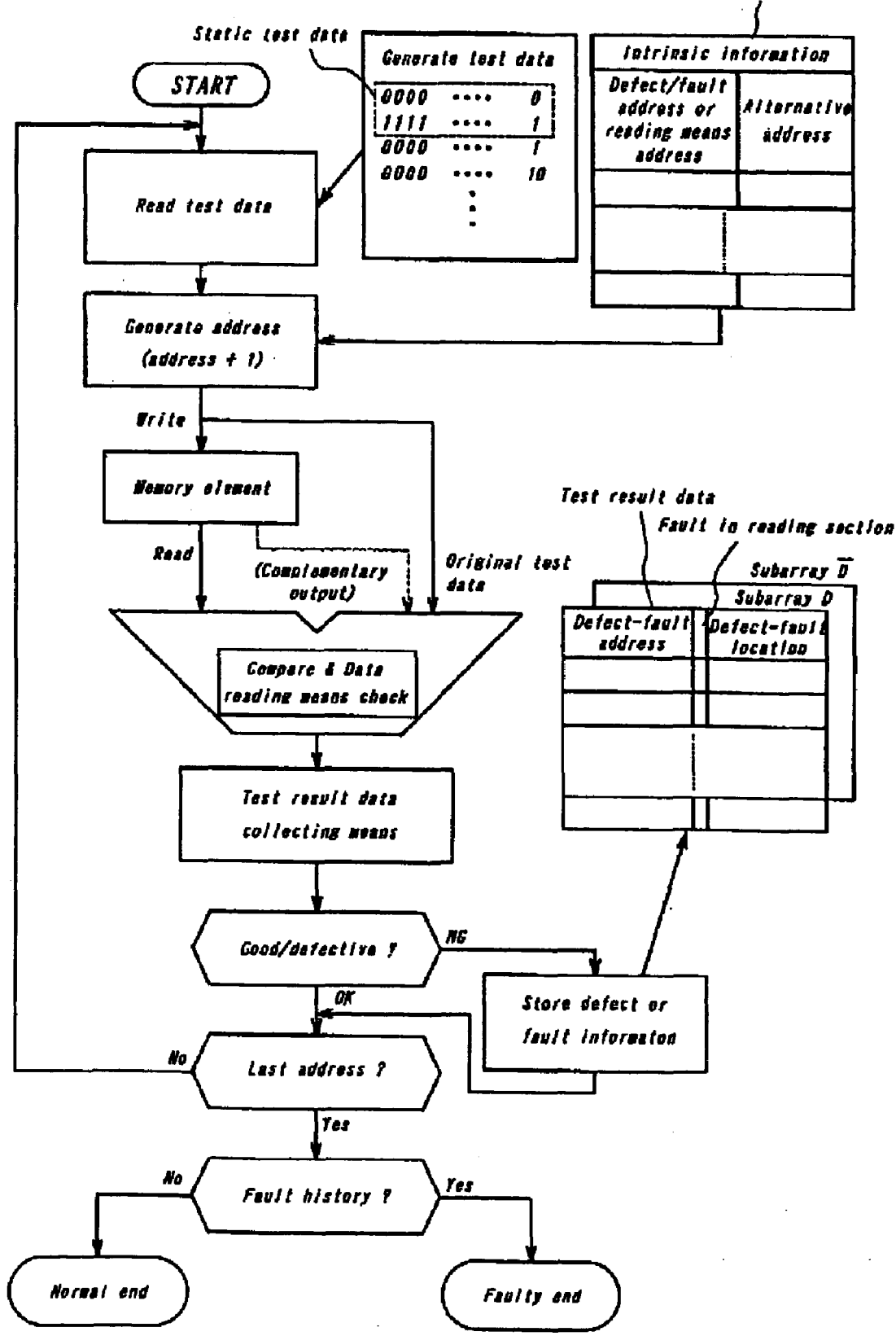
FIG. 4 is a flowchart showing an algorithm of a test system of a semiconductor memory manufacturing process according to the present invention.

FIG. 4 shows an example of a test algorithm according to the present invention. In this algorithm, test data supplied from outside or generated inside are written (stored) into the memory elements according to the addresses supplied from outside or generated inside. Then, typically, a comparison is made between the values read affirmatively and the original test data, and in a pair of (affirmative and negative) read values together, and the results of these comparisons are collected by a test result data collecting means. Further, by the match or the mismatch of the two kinds of comparisons, good/defective products are determined, and if defective, it is stored as the defect or fault information. If it is determined as "good", or if it is determined as "fault or the like" and it is stored as fault information, the above-described test is repeated regarding to the next address, unless the decision relates to the end address. If the decision relates to the end address, it is further determined whether there is a fault history from the beginning address or not, and if there is no fault history, it is determined as "a good product" and the process terminates properly, whereas if there is the fault history, it is determined as "a defective product" and the process terminates.

Figure 5:
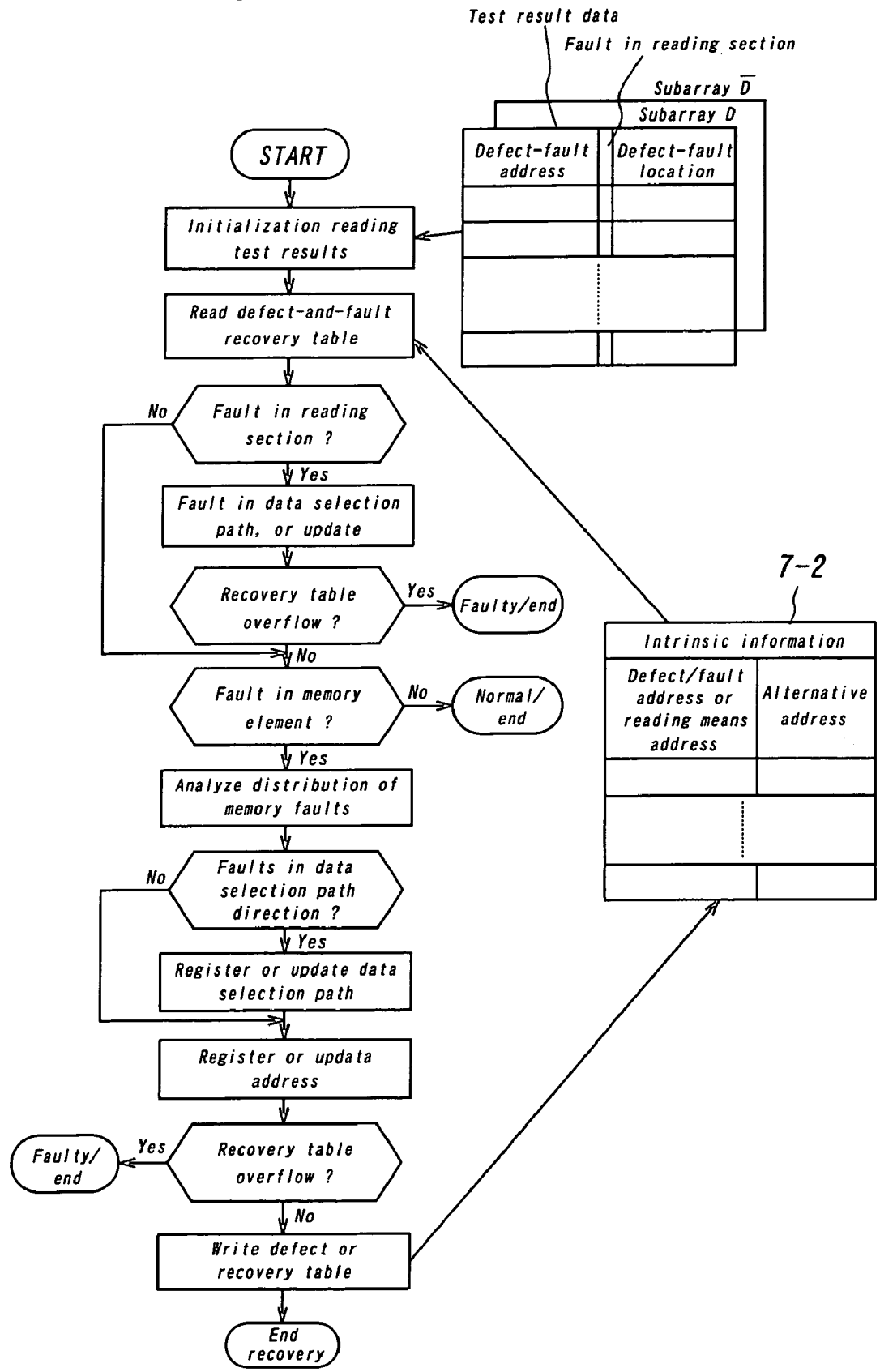
FIG. 5 is a flowchart showing an algorithm of a defect recovery system that is after a test for a semiconductor memory manufacturing process according to the present invention.

FIG. 5 shows an example of an algorithm for recovering defects and faults. In this algorithm, first, the test result data obtained from the test shown in FIG. 4 are read. Then, preparation for reading the defect-and-fault recovery table 7-2 is performed. Then, it is analyzed whether there is the above-mentioned two kinds of faults detected by the two kinds of comparisons, that is, the fault in the storage mechanism of a memory element or not, which fault is detected by the difference of the read value from the original test data, or there is the fault in the data reading section 6, which fault is detected by the match in a pair of read values (that are to be complementary) together. If the fault exists, the faults is registered or updated in the defect-and-fault recovery table 7-2 in a unit of the address or in a unit of the data selection path, and in addition, mapping (correspondence with alternative addresses or alternative paths) is performed for recovery. When the defect-and-fault recovery table 7-2 overflows, the semiconductor memory is determined as defective as it is unrecoverable.

It is common that, as described above, the reading means takes charge of two data selection paths, for example, a sub-array D and a sub-array ¬D, for the purpose of high density integration, and therefore, if necessary, two data selection paths are required to be mapped as a pair for the recovery. Also, since the data selection path has high reliability and the defect or the fault thereof hardly occur in normal use except for the defect or the fault detected as initial defects, the defect or the fault can be changed and recovered hardware-wise before shipment, as in conventional cases.

Then, in the mapping recovery of the defect or the fault in the memory elements, it is analyzed whether the defects or the faults of two-dimensional arrangement of the memory elements are distributed in the direction of addresses or in the direction of data selection paths, so that recovery can be made either in a unit of the address or in a unit of the data selection path to minimize the mapping range. The criterion of the judgment is as follows. When the defects or the faults are distributed entirely or numerously in the direction of the data selection paths, the recovery is made in a unit of the data selection path, whereas when they are distributed numerously in the direction of the addresses, the recovery is made in a unit of the address. It should be noted that, when the defects or the faults are distributed entirely or numerously in the direction of data selection paths, the recovery is made in a unit of the address as far as possible even if, for example, one of the above-described two complementary data selection paths is destroyed absolutely but the other path has a small number of faults.

Figure 6:
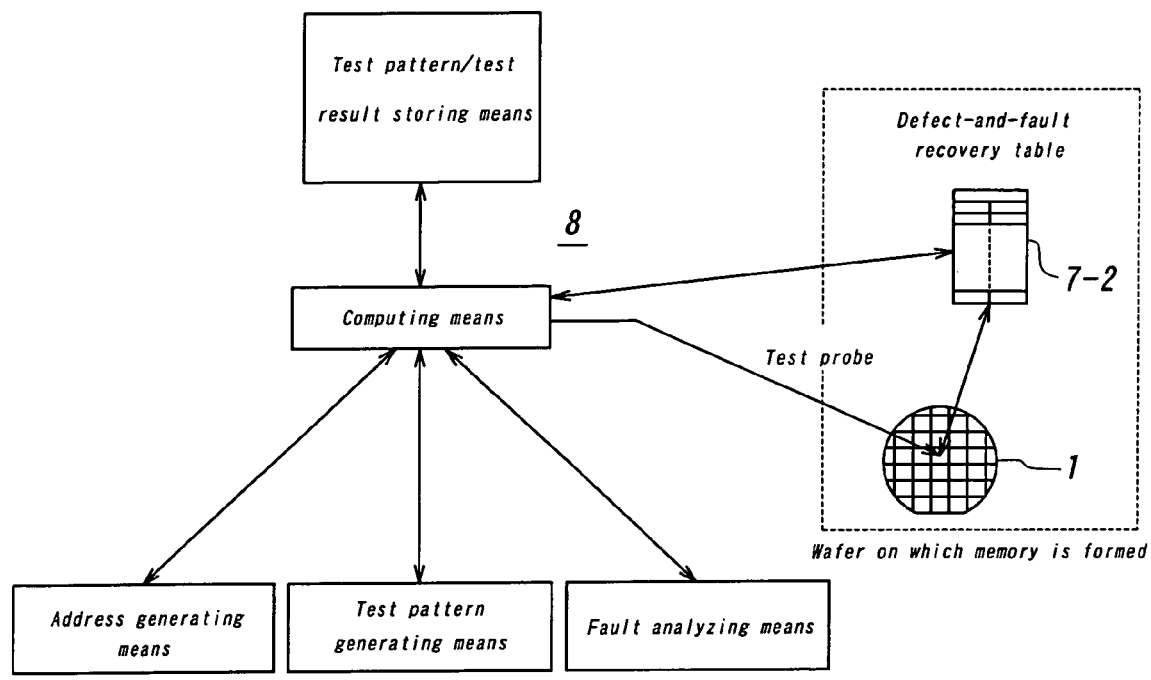
FIG. 6 is a block diagram showing a test and a defect recovery method for a semiconductor memory manufacturing process according to the present invention that are performed in cooperation with a testing means external of the memory.

FIG. 6 shows an embodiment of a test supported by an external tester 8, that is, an embodiment of a test performed by the cooperation the inside of the semiconductor memory with the outside thereof. It shows a method in which the test and the recovery are performed efficiently with the simple test or the precision test by cooperating a self-test function or an auxiliary test circuit (herein, it is the defect-and-fault recovery table 7-2) provided inside the semiconductor memory with an external tester 8.

Figure 7:
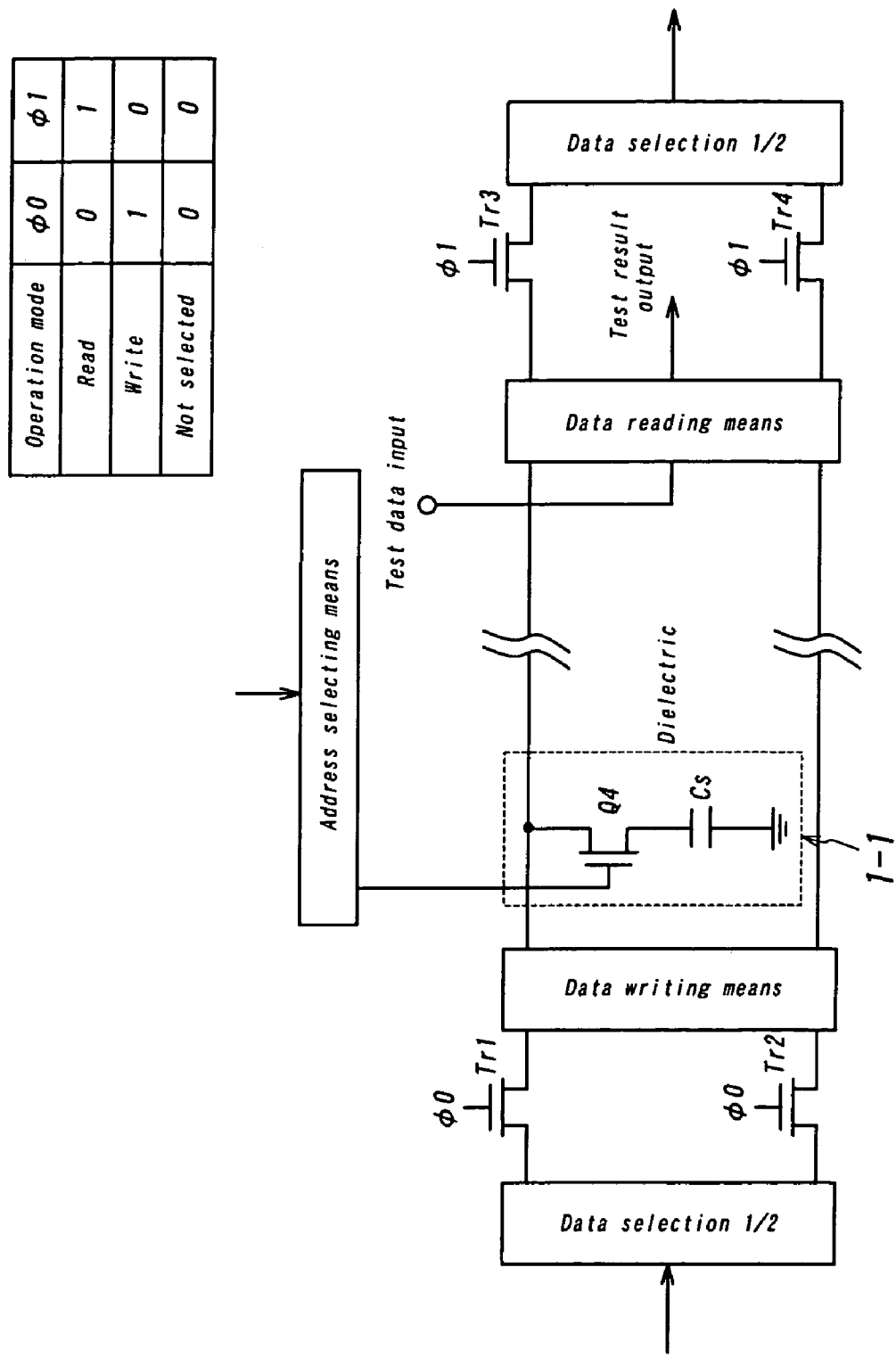
FIG. 7 is a view for showing an embodiment in which a DRAM is used for a semiconductor memory element according to the present invention and recovery is possible.

FIG. 7 shows an embodiment in which a DRAM is used for the memory element 1-1, and three states of a reading operation, a writing operation, and a memory holding (non-selection) are selected and the operation is performed in order to recover fault locations in a unit of the address or in a unit of the data selection path. In this case, since the DRAM is a volatile memory, it has to be refreshed regularly apart from normal read and write operations. In addition, since it is read destructively, a rewrite operation is needed after reading thereof.

In this embodiment, in order to recover along the address line, another address is mapped so that a selecting signal is not supplied from the address selecting means to the address with the defect or the fault. In order to recover along the data selection path, the three selection states are controlled by Tr1, Tr2, Tr3, and Tr4 so that the faulty data selection path is cut off and is mapped to another good location. In this example, the power supplies to the writing means and the reading means are not cut off, but it is also possible to cut off them in the same way, or it is also possible to cut off the data selection path entirely.

Figure 8:
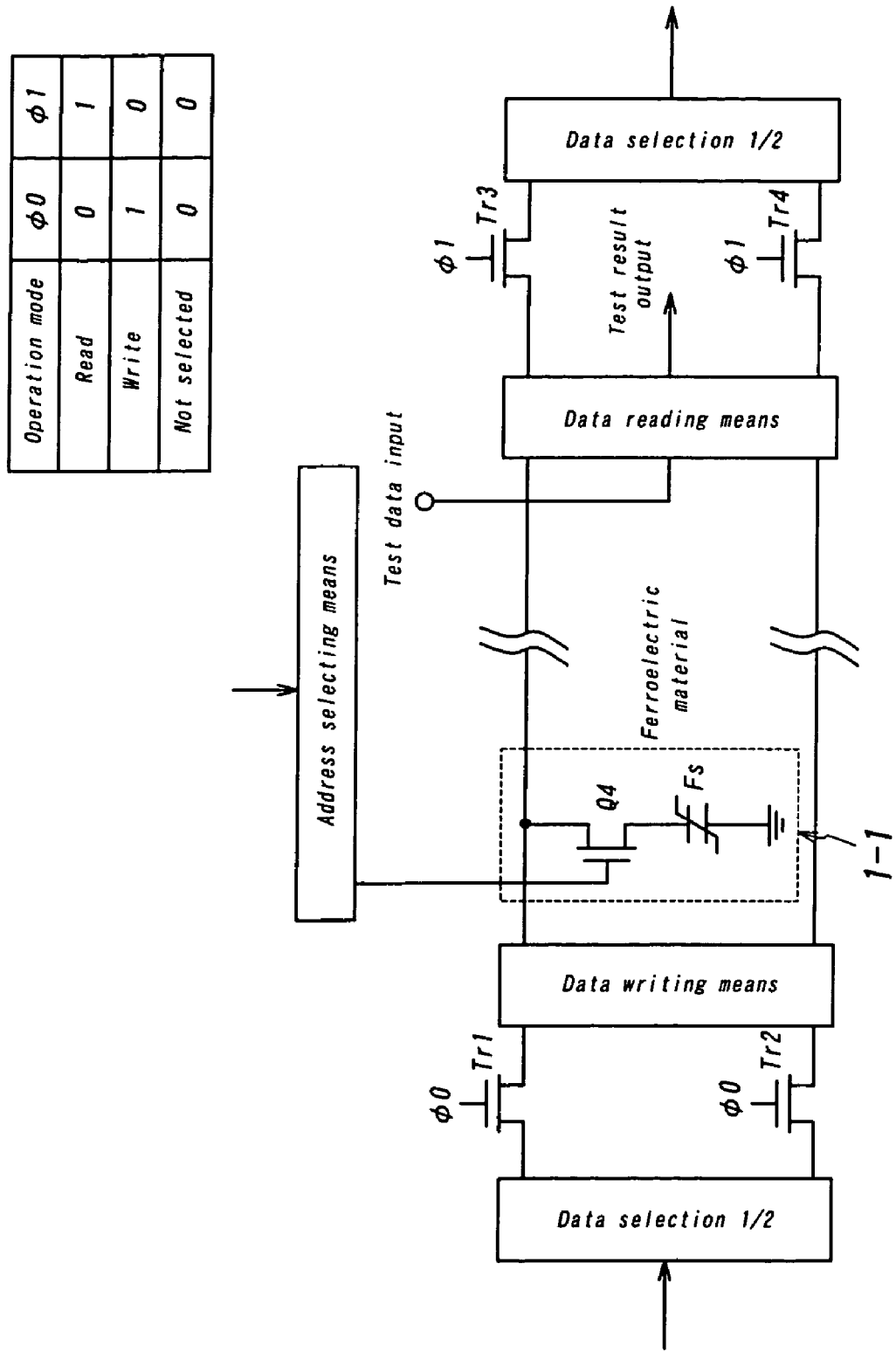
FIG. 8 is a view for showing an embodiment in which a FeRAM is used for a semiconductor memory element according to the present invention and recovery is possible.

FIG. 8 shows an embodiment in which an FeRAM comprising ferroelectric material is used for the memory element 1-1, and the three states of the reading operation, the writing operation, and the memory holding (non-selection) are selected and the operation is performed in order to recover the fault locations in a unit of the address or in a unit of the data selection path. The system of recovery is the same as that as described with reference to FIG. 7, however, in this embodiment, since the memory element 1-1 is nonvolatile and the memory is held semipermanently, the memory element is cut off so as not to be selected.

Figure 9:
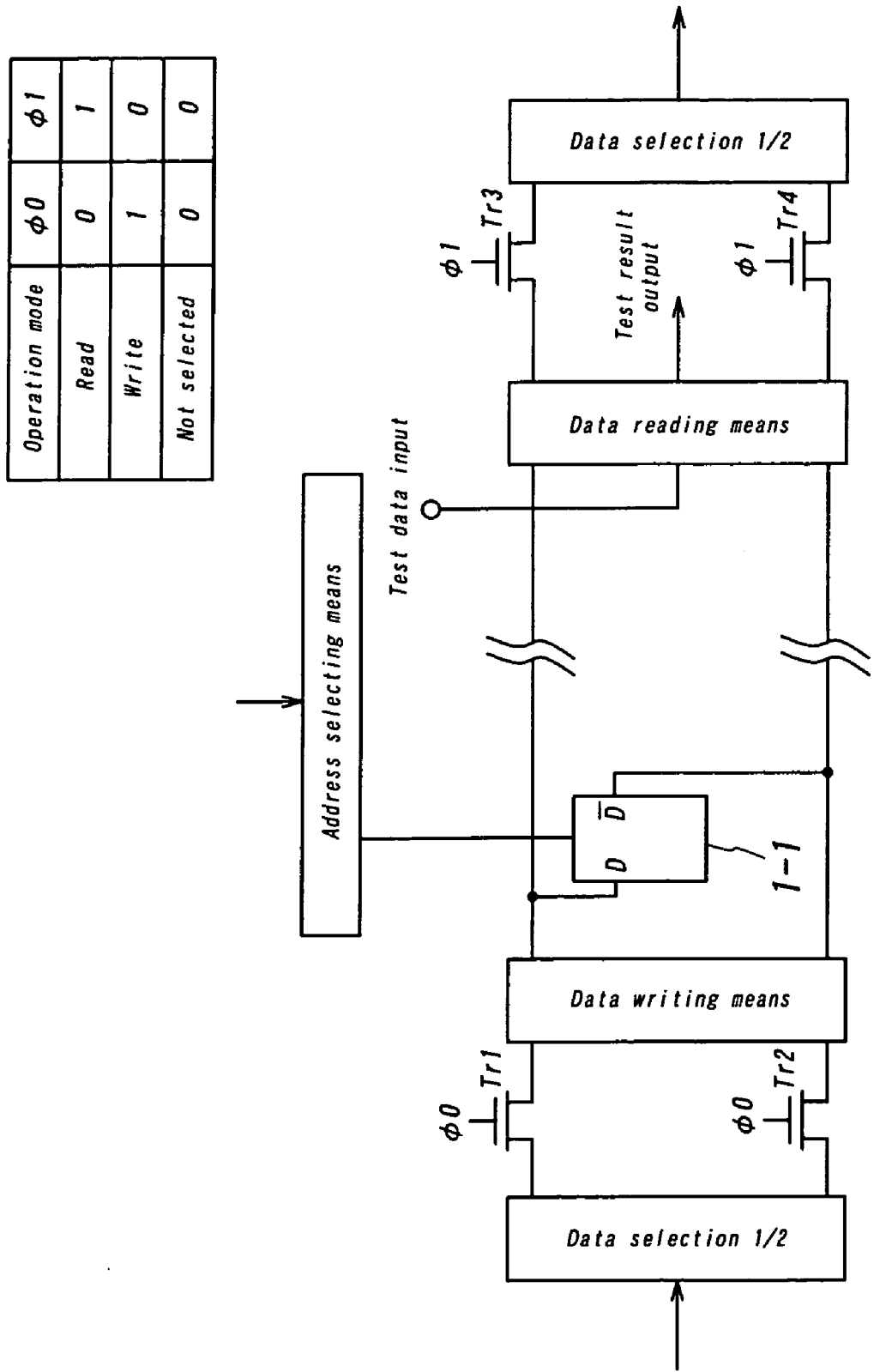
FIG. 9 is a view for showing an embodiment in which a SRAM is used for a semiconductor memory element according to the present invention and recovery is possible.

FIG. 9 shows an embodiment in which an SRAM is used for the memory element 1-1, and the three states of the reading operation, the writing operation, and the memory holding (non-selection) are selected and the operation is performed in order to recover the fault locations in a unit of the address or in a unit of the data selection path. The system of the recovery is the same as that as described with reference to FIG. 7, however, because it is necessary to supply the power at all times for holding memory, it is important to cut off the power supply in a unit of the memory element, the address, or the selection path so as not to select each of the memory element 1-1 occurring the defect or the fault, or the address or data selection path belonging to the memory element 1-1.

Figure 10:
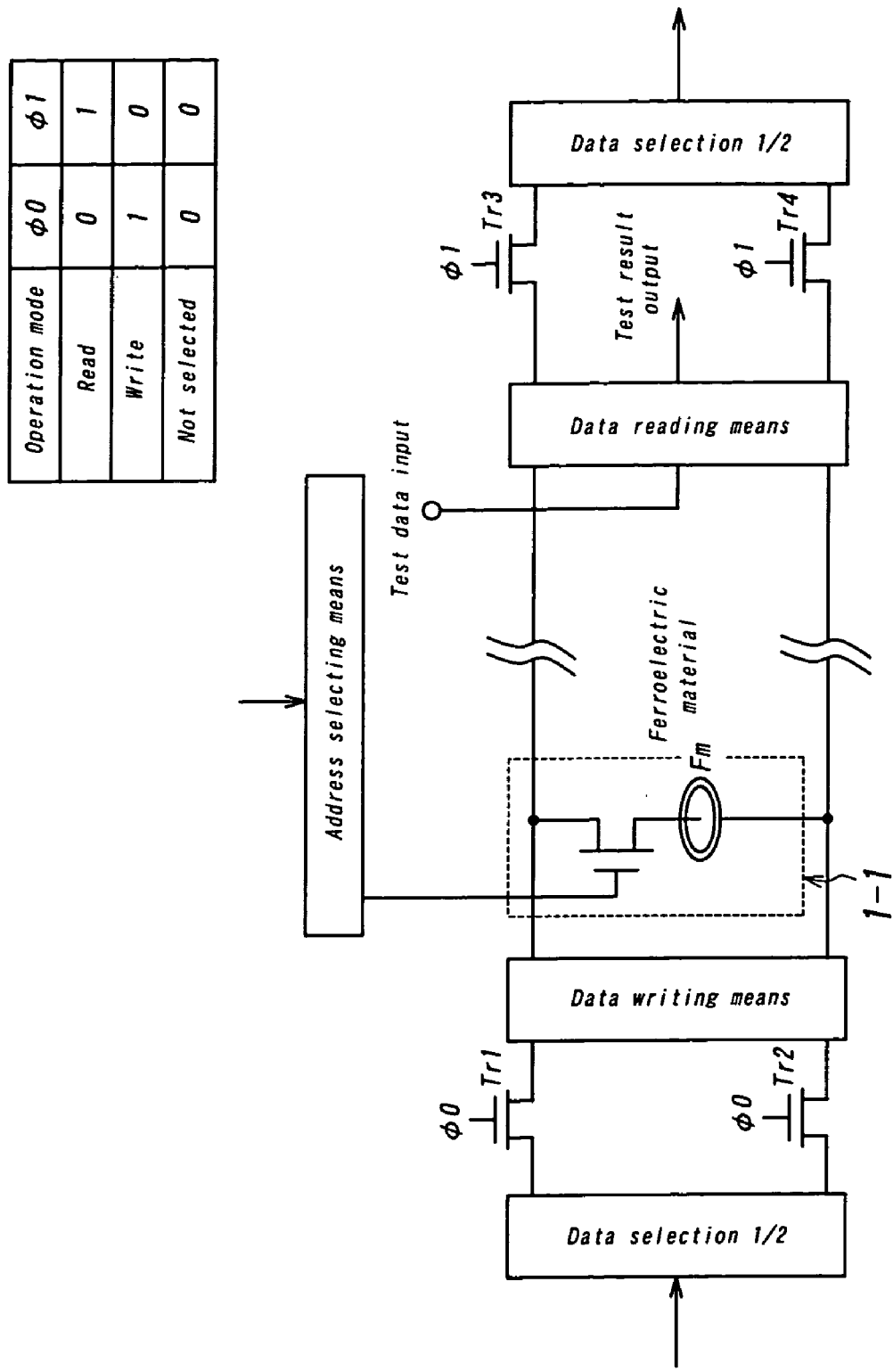
FIG. 10 is a view for showing an embodiment in which a MRAM is used for a semiconductor memory element according to the present invention and recovery is possible.

FIG. 10 shows an embodiment in which a MRAM comprising ferromagnetic material is used for the memory element 1-1, and the three states of the reading operation, the writing operation, and the memory holding (non-selection) are selected and the operation is performed in order to recover the fault locations in a unit of the address or data selection path. The way of the recovery is the same as that as described with reference to FIG. 7, however, because the MRAM in this embodiment is nonvolatile and the memory is held semipermanently, the memory element is cut off so as not to be selected.

Figure 11:
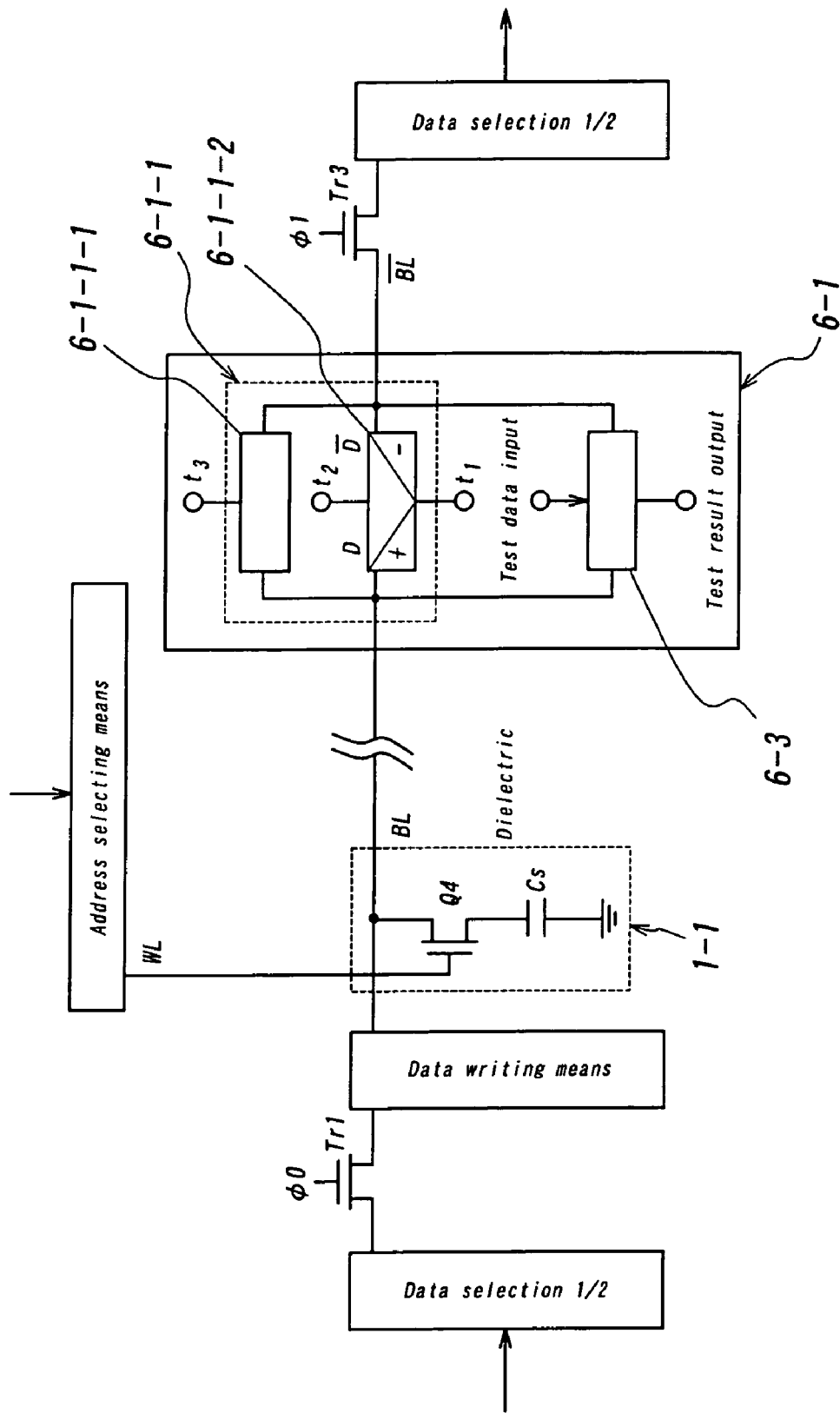
FIG. 11 is a view for showing an embodiment of a semiconductor memory using a DRAM in which a fault test is possible, according to the present invention.

FIG. 11 is a view for illustrating the operation of the fault testing means necessary for the fault testing by showing the embodiment of FIG. 7 in detail at the functional level thereof. As described above, the DRAM is used for the memory element 1 in FIG. 7. However, the memory elements may be various elements including the above-described elements, and in those cases, various additional operations according to the types of elements are performed in addition to the basic operation as described below.

The functional construction of this memory will be described only about the read operation thereof, which is necessary for the fault testing. The primary section of the memory shown consists of the memory element 1-1 composed of a transistor Q4 for selecting and being connected to a data line BL and an address selecting line WL, and a capacitor Cs for storing charge; a reading circuit 6-1-1 both ends of which are respectively connected to a data line BL for reading and ¬BL for generating a comparison value, the reading circuit amplifying and reading the potential difference therebetween; and a fault detecting means 6-3 for detecting the fault from a pair of affirmative and negative outputs comprising D, ¬D which are read. Here, in the read circuit 6-1-1, t1 represents a signal input terminal for reading, t2 represents a signal input terminal for increasing the voltage, and t3 represents a signal input terminal for a pre-charge operation. By cutting off signals to these terminals, the operation of the read circuit 6-1-1 is stopped to be floating, and thus power consumption can be suppressed.

Figure 12:
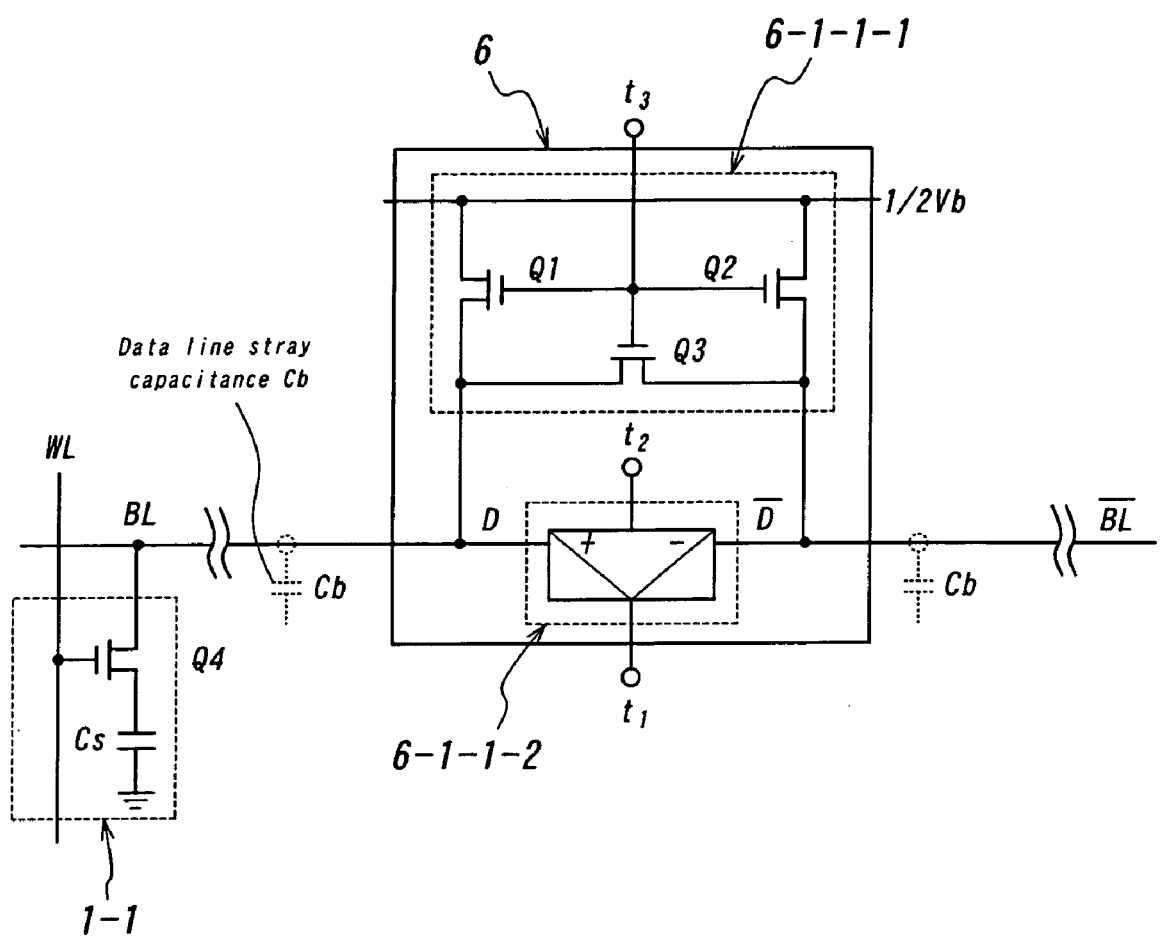
FIG. 12 is an example showing a semiconductor DRAM memory used in the embodiment illustrated in FIG. 11.
Figure 13A:
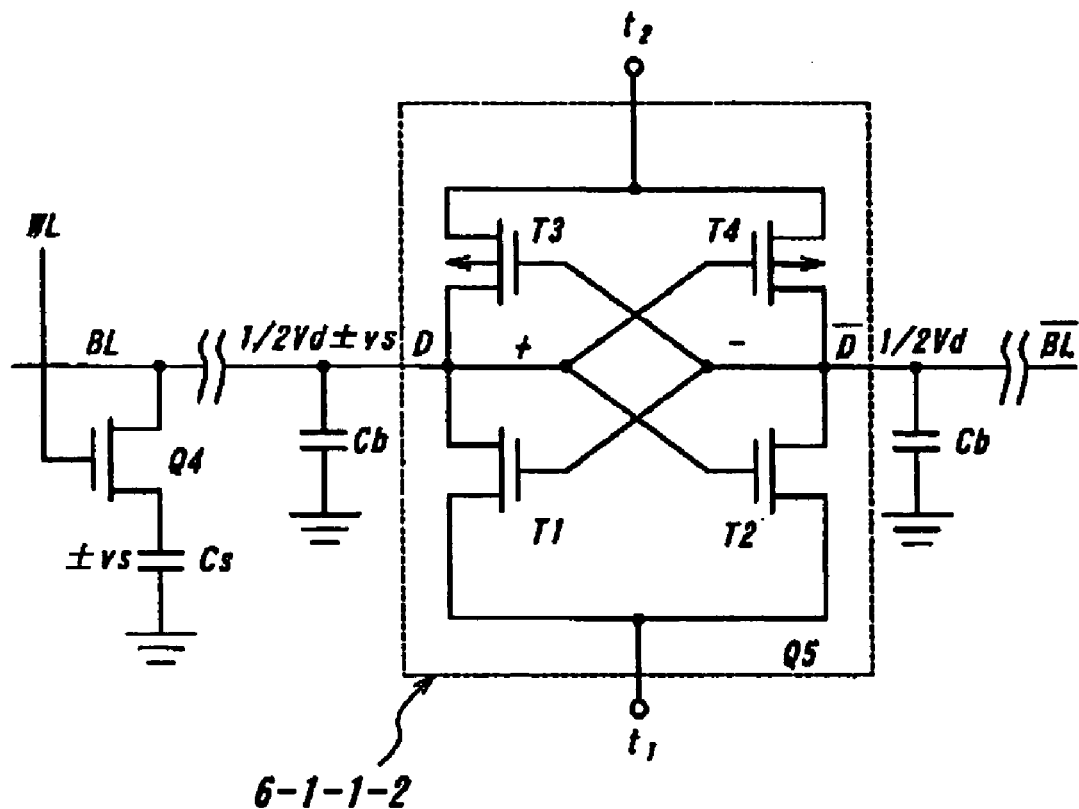
FIG. 13 is an example showing a sense amplifier of a semiconductor DRAM memory used in the embodiment illustrated in FIG. 11.
Figure 13B:
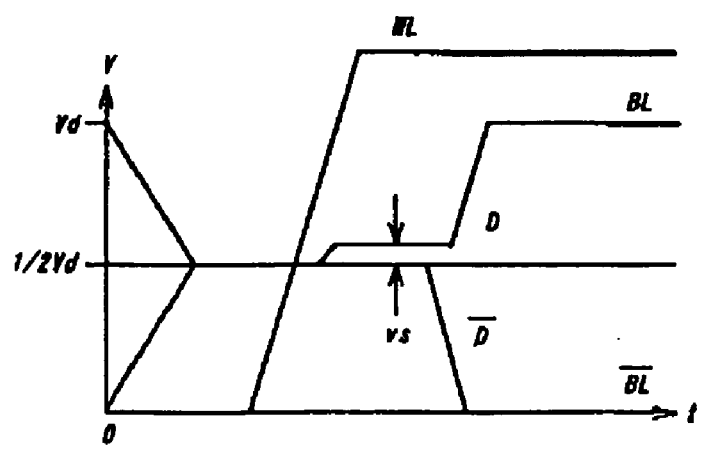

FIG. 12 shows a public known example given for explaining the operation of FIG. 11 as the DRAM type memory. The data reading means 6-1 comprises a pre-charge means 6-1-1-1 and a reading means 6-1-1-2 composed of a sense amplifier. There are various ways for the constructions of the generation of the reference potential, the read operation, and the write operation for the sense amplifier. FIG. 13a shows an example of constructing the DRAM as the reading means using a CMOS type sense amplifier shown in H. Kawakubo, Y. Yamaguchi, S. Yasui: A 288Kb CMOS Pseudo SRAM, ISSCC84, pp. 276–277, 1984, for example. The operation will be explained with reference to this example and the operation waveform diagram thereof as shown in FIG. 13b.

The operation of this DRAM is as follows. The sense amplifier type reading means 6-1-1-2 is placed at the center thereof, and the same number of memory elements are connected to a data line BL and a data line ¬BL, respectively, and the stray capacitance Cb of the data lines are made equal to each other. The memory elements is composed of the transistor Q4 for selection and the capacitor Cs for storing the data. The memory elements performs the selection operation by turning the transistor Q4 ON with a gate signal from a word line WL, and the writing operation is performed by applying a data signal from a data line BL, which data signal is supplied to the capacitor Cs via the transistor.

On the other hand, in the reading operation, first, the stray capacitance Cb of the data lines BL, ¬BL are charged to a potential of ½ Vd by a pre-charge circuit composed of transistors Q1, Q2, and Q3 (see FIG. 12), and next, these data lines BL, ¬BL are made to enter a floating state. When such a pre-charge completes, a reading-ready state is entered. Then, the word selecting line WL is turned ON to establish the potential of the data line BL according to the difference of ±vs caused by the ratio Cs/(Cs+Cb) of the charge stored in the capacitor Cs in the memory element, and t1 is turned ON to operate the sense amplifier. Of the data lines BL and ¬BL, the potential of the one with a lower potential is reduced to 0 V, and at the substantially same time, t2 is turned ON to increase the potential of the high potential side of data line BL from ½ Vd to Vd, so that reading operation is performed. Thereafter, the destructed Cs is rewritten.

The sense amplifier of FIG. 13a is generally composed of a cross-coupling type amplifier. To amplify the read data, a voltage latch type flip-flop composed of NMOS transistors T1 and T2 is used, and for active restoring, a flip-flop composed of PMOS transistors T3 and T4 are used. The former (NMOS amplifier) discharges the low potential side of the data line to 0 V, and the latter (PMOS amplifier) charges the high potential side of the data line to Vd. Finally, the sense amplifier operates as a CMOS sense amplifier for amplifying the data lines BL, ¬BL to 0 V and Vd, respectively.

The operation waveforms of the respective portions thereof will be described in detail with reference to FIG. 13b. First, the stray capacitance Cb of data lines BL, ¬BL is pre-charged (for example, from the respective initial potentials, Vd or 0 V) to a voltage of ½ Vd, for preparation. In reading, when Q4 is turned ON by a selection signal WL (a constant potential that rises from zero steeply and is established), in the case of memory "1", where the voltage stored in the capacitor Cs of the memory element is +vs, the data lines are: BL=½ Vd+vs, and ¬BL=½ Vd.

Next, when the drain potentials of T1 and T2 decreases in response to a signal input to t1 for turning the flip-flop ON, the gate voltage difference between the cross-coupling type transistors T1 and T2 (initially, the potential difference +vs between both terminals of the sense amplifier) is amplified as t1 decreases. Thereby, the width of the potential difference between the terminals D and ¬D increases, and the low potential side of data line BL reduces to 0 V. Further, at the substantially same time as t1, t2 is turned ON to increase voltage by the transistors T3 and T4, and thus the high potential side of data line BL increases to Vd. Finally, the logical values of the output terminals D and ¬D of the voltage latch type flip-flop are determined to be 0 and 1, respectively.

As shown in the above-mentioned example, generally, a differential system is adopted in the sense amplifier, and a pair of complementary outputs of a affirmative and a negative are obtained under the normal condition. Further, as a specific and preferable read construction of the memory, as described above with reference to FIGS. 3a and 3b, the numbers of memory elements or a set of plurality of memory elements, which are connected to the data lines BL and ¬BL with the sense amplifier interposed therebetween, (or the number of dummy elements, although not used in the examples shown here) are symmetrical and are connected taking the stray capacitance into consideration.

Here, typical faults in the examples in FIGS. 11, 12, and 13 are discussed. Major reasons of a single fault in a DRAM are result from the capacitors Cs in the memory elements and are result the data reading system. Generally, the dummy elements are also considered as part of the reading system.

In the general embodiments of the present invention, an object of the test is limited to the above-mentioned memory elements 1-1 and the reading means 6-1-1-2 in the data reading section 6. The fault diagnosis is performed under the assumption that various lines and peripheral circuits such as for pre-charges, address decoders, and data registers have a reliability substantially same as that of other semiconductor memories except for the initial defects thereof, and therefore, the test relating to the memory is not performed; also it is assumed that a plurality of constituent elements are not destroyed at the same time.

Therefore, all of the faults are detected collectively in the operation of the sense amplifier, namely the flip-flop, and thus, all of the conditions are tested by comparing the data output from the read terminals D and ¬D with predetermined reference values, after all. In this test, specifically, the logical values of the established output terminals D and ¬D of the flip-flop are read taking the original test data as reference, and the values are selectively computed with reference to the reference values. By evaluating the results of the computation, the faults are detected.

Major fault locations in the respective portions are classified into the following three locations:
(1) the fault in the memory elements,
(2) the fault in the dummy elements, and
(3) the fault in the sense amplifier system.

Major possible reasons of these are as shown in Tables 6 and 7.

TABLE 6

List of single fault (I)

Fault location

| Fault portion | Component | Reason | Influence of fault | Read result |
|---|---|---|---|---|
| Memory element | Cs | Short circuit | Memory element | Specific bit is always 0 |
| | Cs | Reduced capacitance | Memory element | Specific bit is always indefinite, |
| | Q4 | Short circuit | Memory element | Specific bit is always indefinite, and other bits are also affected |
| | Q4 | Open | Memory element | Specific bit is indefinite |
| Reading section | T1 | Short circuit | Data line | BL is always 0 |
| | T1 | Open | Data line | BL is always 1 |
| | T2 | Short circuit | Data line | BL is always 0 |
| | T2 | Open | Data line | BL is always 1 |

TABLE 7

List of single fault (II)

Fault location

| Fault portion | Component | Reason | Influence of fault | Read result |
|---|---|---|---|---|
| Reading section | T1, T2 | Short circuit | Data line | BL, ¬BL are always 0 |
| | T1, T2 | Open | Data line | BL, ¬BL are always 1 |
| | T3 | Short circuit | Data line | Affected when BL is always 0 |
| | T3 | Open | Data line | BL never becomes 1 |
| | T4 | Short circuit | Data line | Affected when ¬BL is always 0 |
| | T4 | Open | Data line | BL never becomes 1 |
| | T3, T4 | Short circuit | Data line | Affected when BL or ¬BL is always 0 |
| | T3, T4 | Open | Data line | BL or ¬BL never becomes 1 |

The fault of the CMOS sense amplifier are classified into faults of T1 and T2 and those of T3 and T4, and the fault of T1 and T2, which makes the sense amplifier operate, clearly appears in the outputs, but the fault of T3 and T4, which serves as the active restore, appears unclearly.

Thus, the necessary and sufficient information for the test is obtained from the outputs from the sense amplifier. The simple test is summarized in the previous Table 4, but this is revised in the following Table 8, in which the following two cases are distinguished; (*1) when it is clear that the fault is in the memory element or the dummy element, and (*2) because of the fault in the sense amplifier (the case where EXOR=1 because D, ¬D values are both "0" or "1" and are thus equal), in appearance, it is detected that the memory element is normal or the memory element is faulty (EXOR=0 or 1), and the fault in the sense amplifier is determined, but it is unclear therefrom if there is the fault in the memory element or the dummy element.

TABLE 8

| Test data | Memory | Sense amplifier output | | | Operation result | Diagnosis result |
|---|---|---|---|---|---|---|
| | | D | ¬D | ¬EXOR | EXOR | (1: fault) |
| X | X | 0 | 0 | 1 | 0 | 1 *2 |
| 0 | 0 | 0 | 1 | 0 | 0 | 0 |
| 0 | 1 | 1 | 0 | 0 | 1 | 1 *1 |
| 1 | 0 | 0 | 1 | 0 | 1 | 1 *1 |
| 1 | 1 | 1 | 0 | 0 | 0 | 0 |
| X | X | 1 | 1 | 1 | 1 | 1 *2 |

Figure 14:
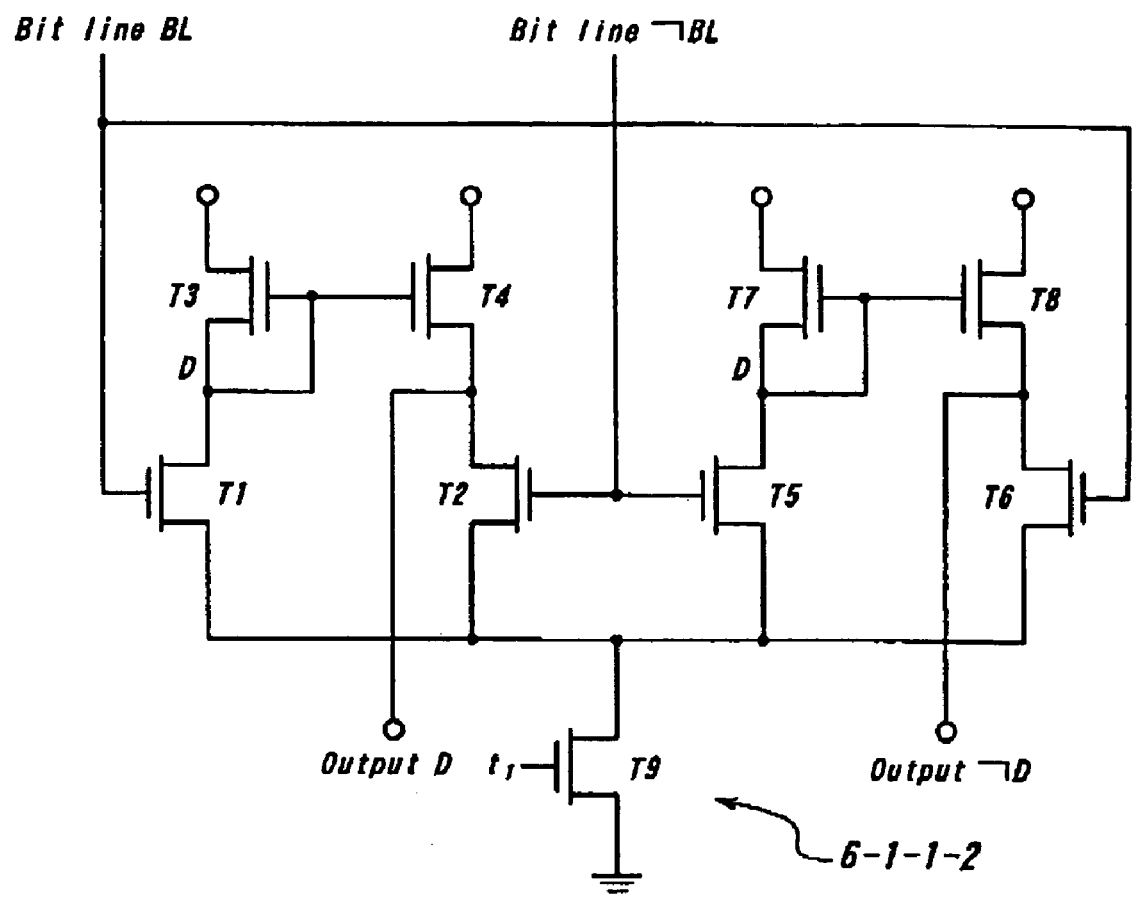
FIG. 14 is a view for showing an example of another sense amplifier used in the embodiment illustrated in FIG. 11.
Figure 15:
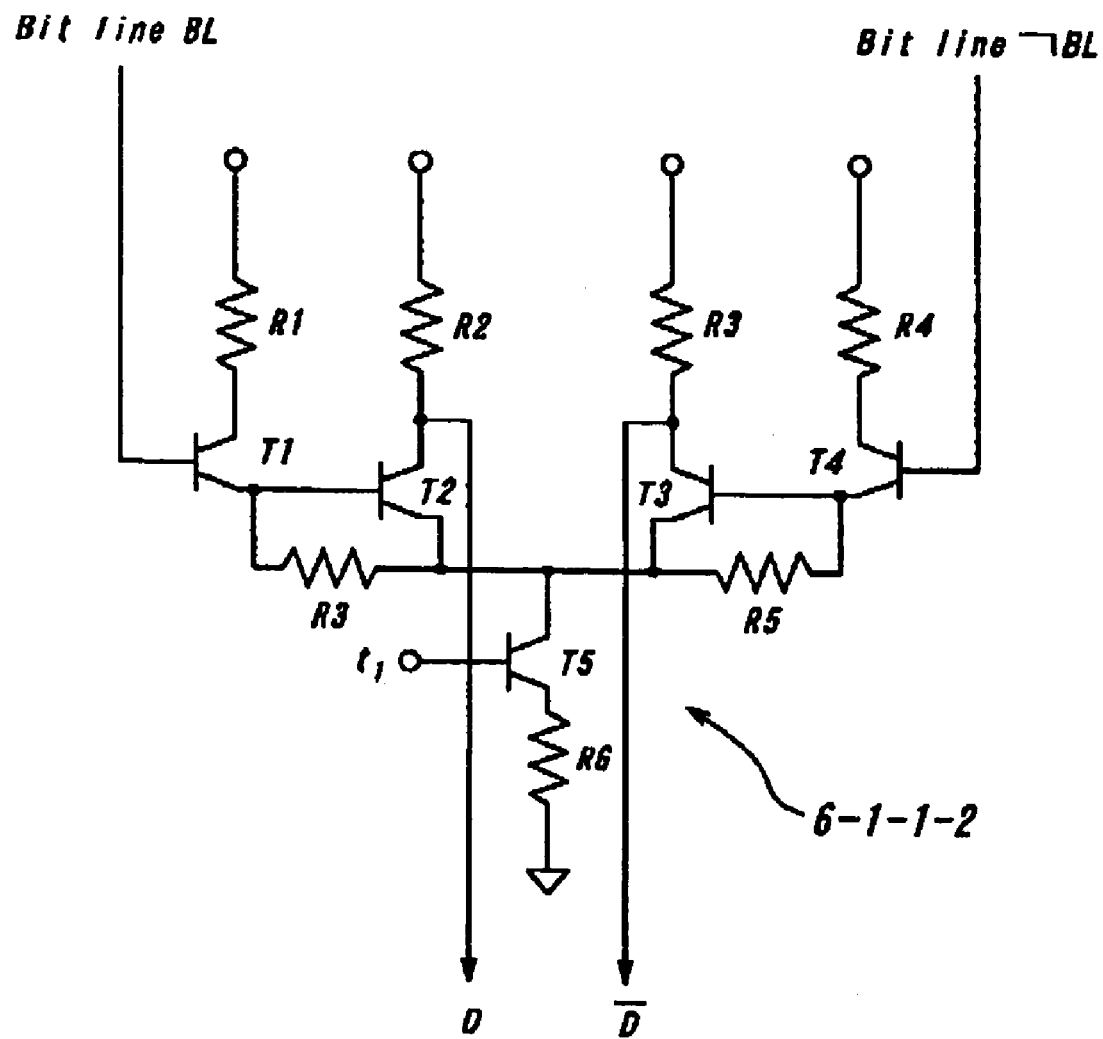
FIG. 15 a view for showing another example of the other sense amplifier used in the embodiment illustrated in FIG. 11.

In addition to the examples as described before, examples of the sense amplifier further include a symmetrical current mirror sense amplifier type shown in FIG. 14, a bipolar differential sense amplifier type shown in FIG. 15, or the like. The operations thereof are briefly described below.

In the symmetrical current mirror sense amplifier of FIG. 14, the memory elements and the dummy elements are connected to the data lines BL and ¬BL in a similar manner to that of the amplifier shown in FIG. 13, and the potential difference caused by the charges are compared with a certain level and amplified to output the operation results to the terminals D and ¬D.

A bipolar differential sense amplifier shown in FIG. 15 is used together with a CMOS-SRAM with low power consumption because it operates at high speed in a similar manner as shown in FIGS. 13 and 14. In addition, the amplifier works effectively when the amplifier is combined with an MRAM with a low resistance in the data line; the memory elements and the dummy elements are connected to the data lines BL and ¬BL, and the potential difference caused by the charges are compared with a certain level and amplified to output the operation results to the terminals D and ¬D.

Figure 16:
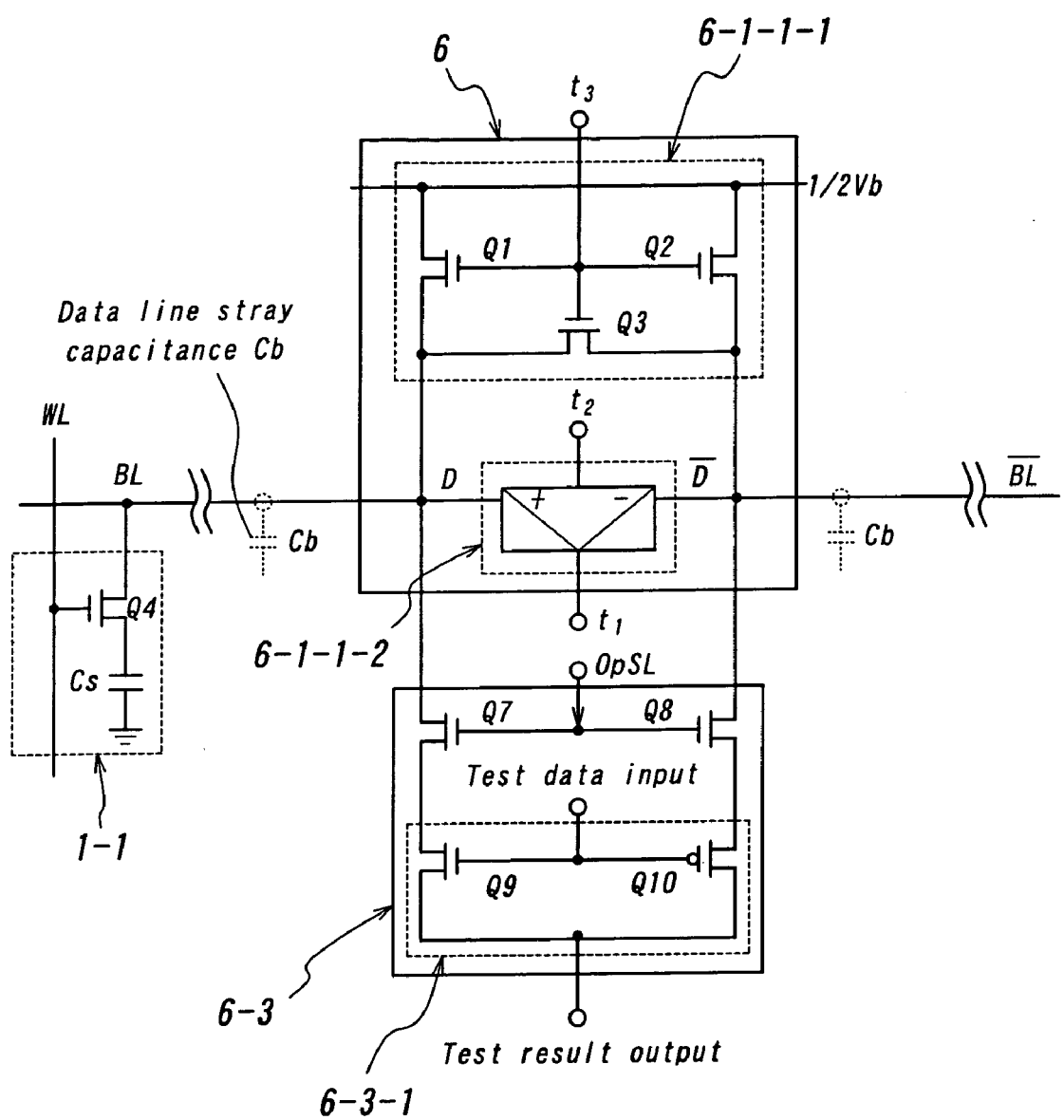
FIG. 16 is a view for showing a detailed embodiment in which the DRAM memory shown in FIG. 11 is tested.

FIG. 16 shows a construction of a memory capable of detecting the fault by reading the DRAM according to the present invention affirmatively and negatively with reference to the test data, and with this construction, it is possible to explain the detailed operations of detecting the fault by comparing the data D or ¬D read from the sense amplifier with a certain level in the DRAM specifically shown in FIGS. 11, 12, and 13. The read data D, ¬D are led to Q9, Q10 in the fault detecting means by controlling Q7, Q8 with a fault test computing starting signal OpSL, and as the read data from the memory elements, they are subjected to the EXOR operation for comparing the read data with an original test data; then outputs indicating a match or mismatch (fault: the diagnosis result *1 in Table 7) are generated from the operation result output terminal.

Figure 17:
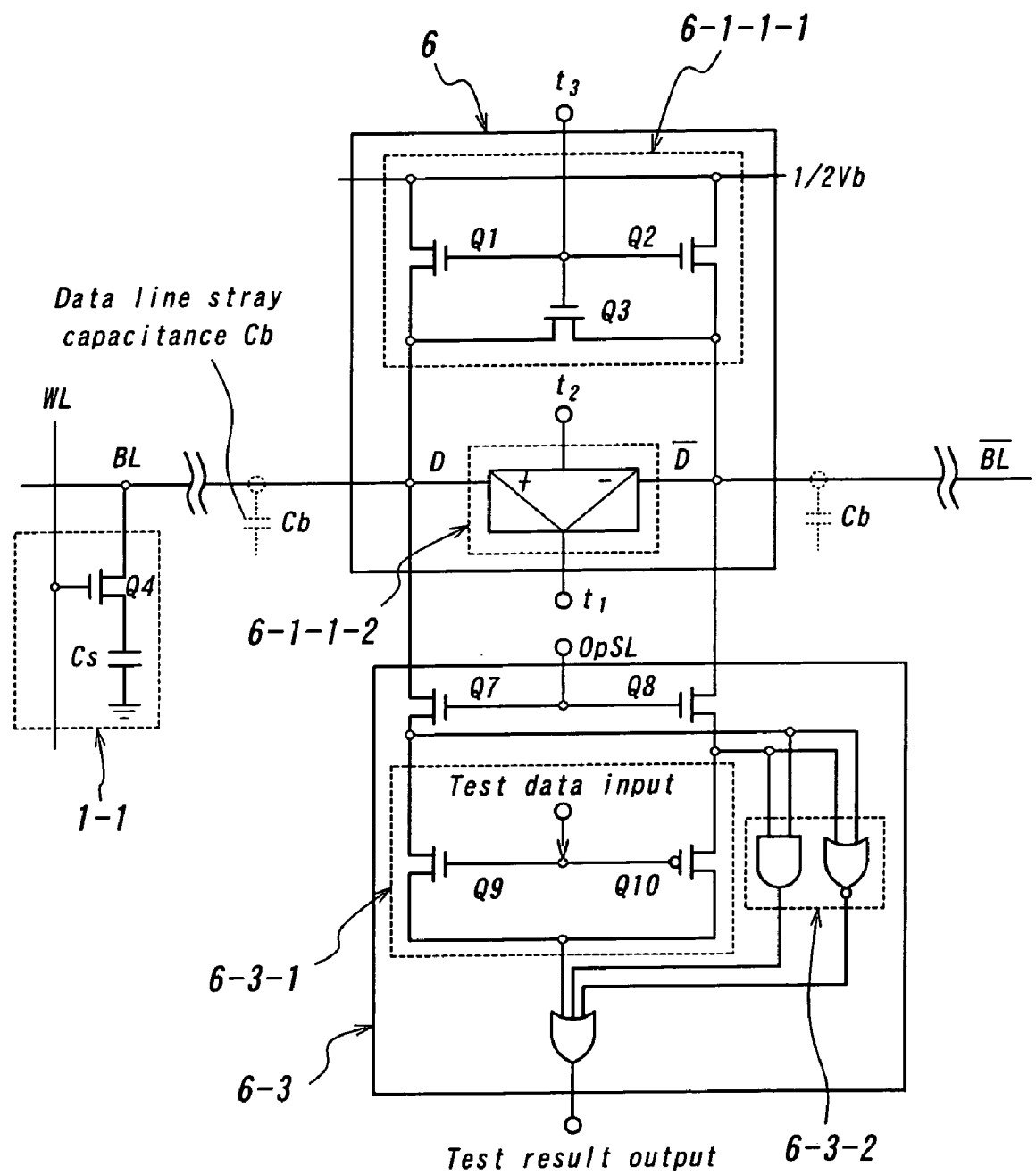
FIG. 17 is a view for showing a detailed embodiment in which the DRAM memory and the sense amplifier shown in FIG. 11 is tested.

FIG. 17 shows a construction of a memory with the fault detecting means performing an EXOR operation for the sense amplifier outputs D, ¬D in addition to the construction of FIG. 16. In this construction, similar to the case of FIG. 16, not only data D, ¬D read from the sense amplifier are compared with the original fault test data to detect the fault in the memory elements, but also the above-mentioned EXOR operation for the amplifier outputs are performed utilizing the fact that the AND (1, 1) or NOR (0, 0) of data D, ¬D represents EXOR=1, in order to detect the fault in the reading system. That is, in the sense amplifier of the data reading system, it is expected that at least one of a pair of transistors that are cross-coupled as shown in FIG. 13a suffer from the fault, and in order to detect such multiple faults, a function for detecting a match between the sense amplifier outputs D and ¬D (strictly, a logical value that should be ¬D) is added. This makes it possible to detect the fault in the memory elements (diagnosis result *1 in Table 7) and that in the data reading system (diagnosis result *2 in Table 7), separately.

Figure 18:
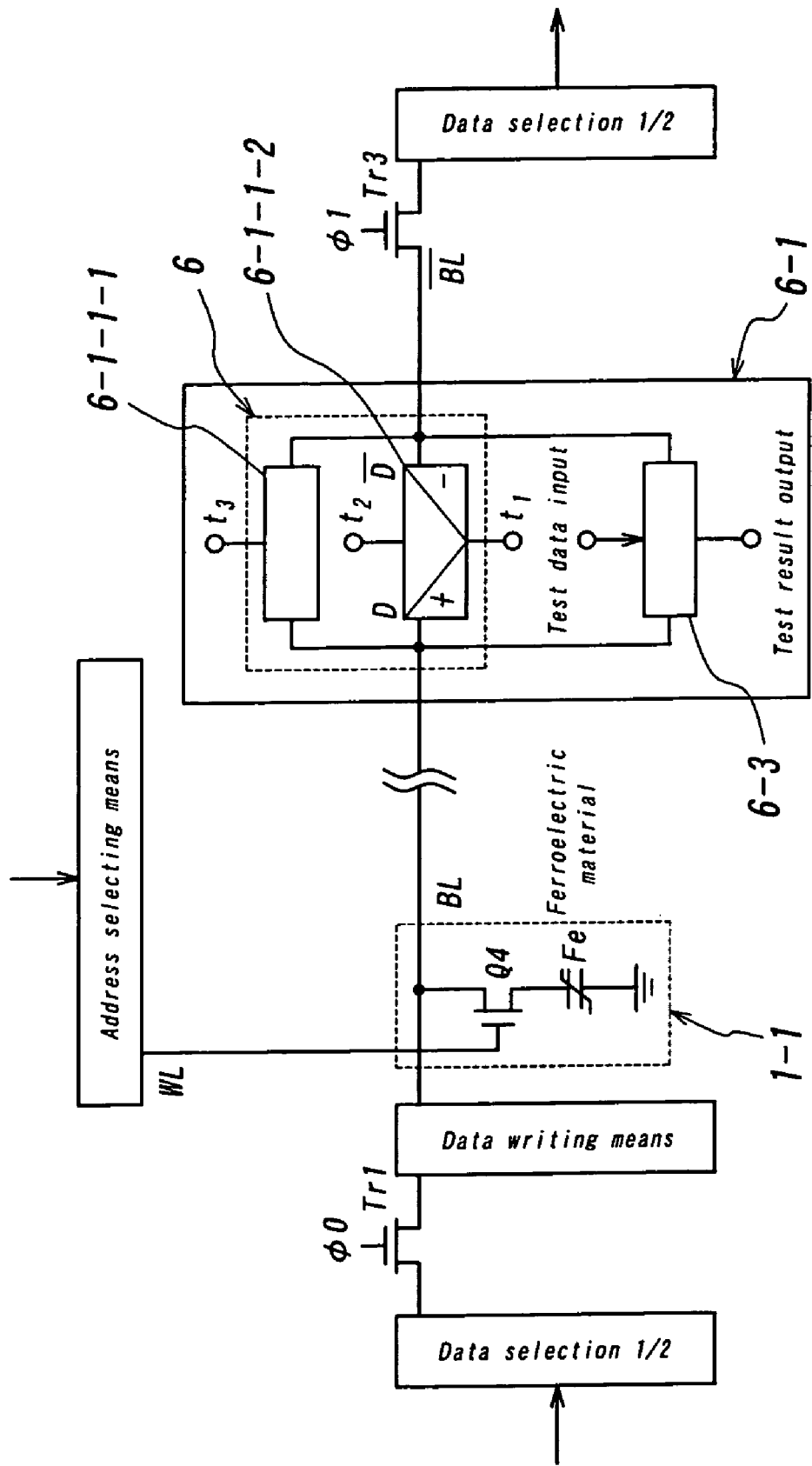
FIG. 18 is a view for showing an embodiment of a semiconductor memory adopting the ReRAM illustrated in FIG. 8, in which a fault test is possible, according to the present invention.
Figure 19:
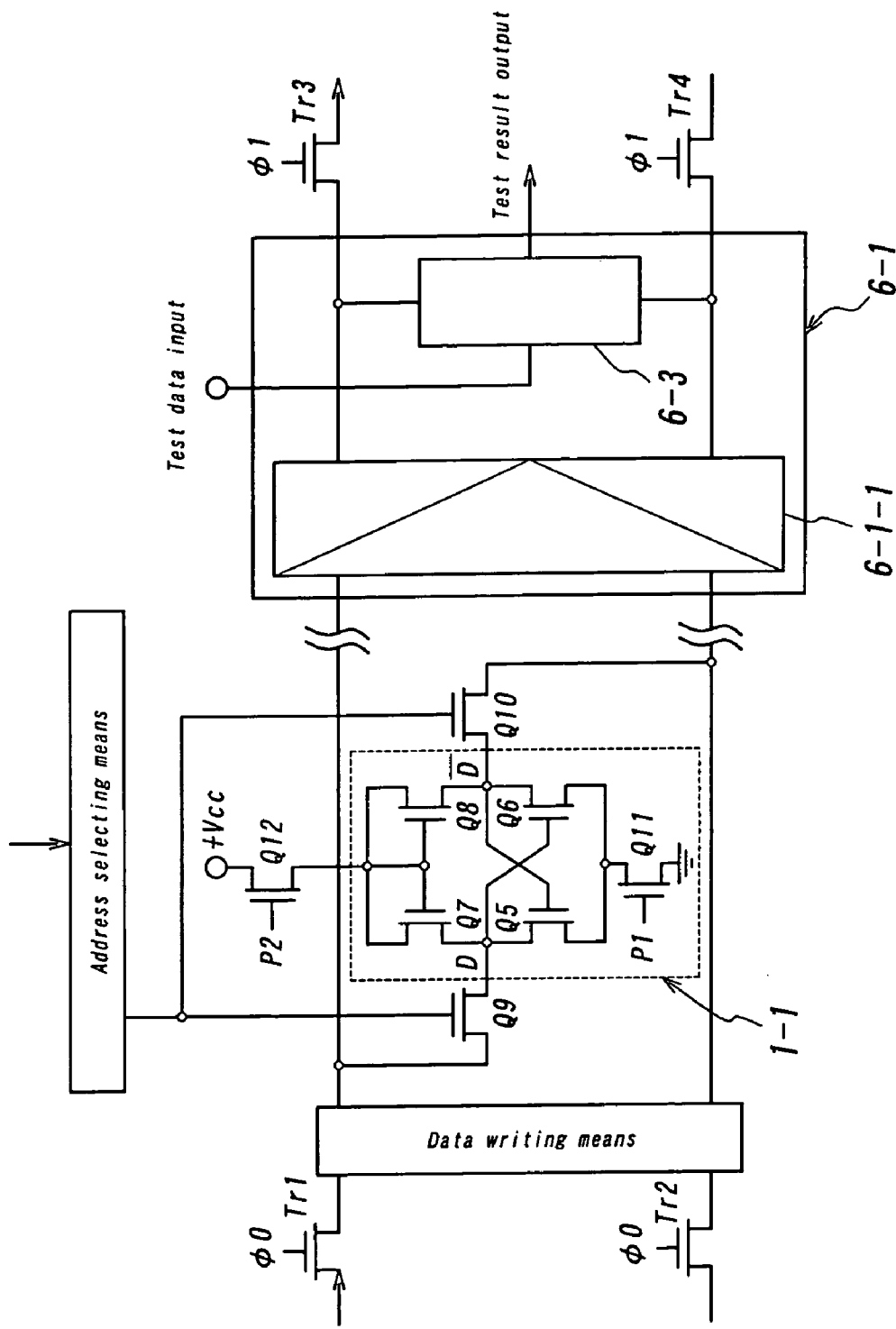
FIG. 19 is a view for showing an embodiment of a semiconductor memory adopting the SRAM illustrated in FIG. 9, in which a fault test is possible, according to the present invention.
Figure 20:
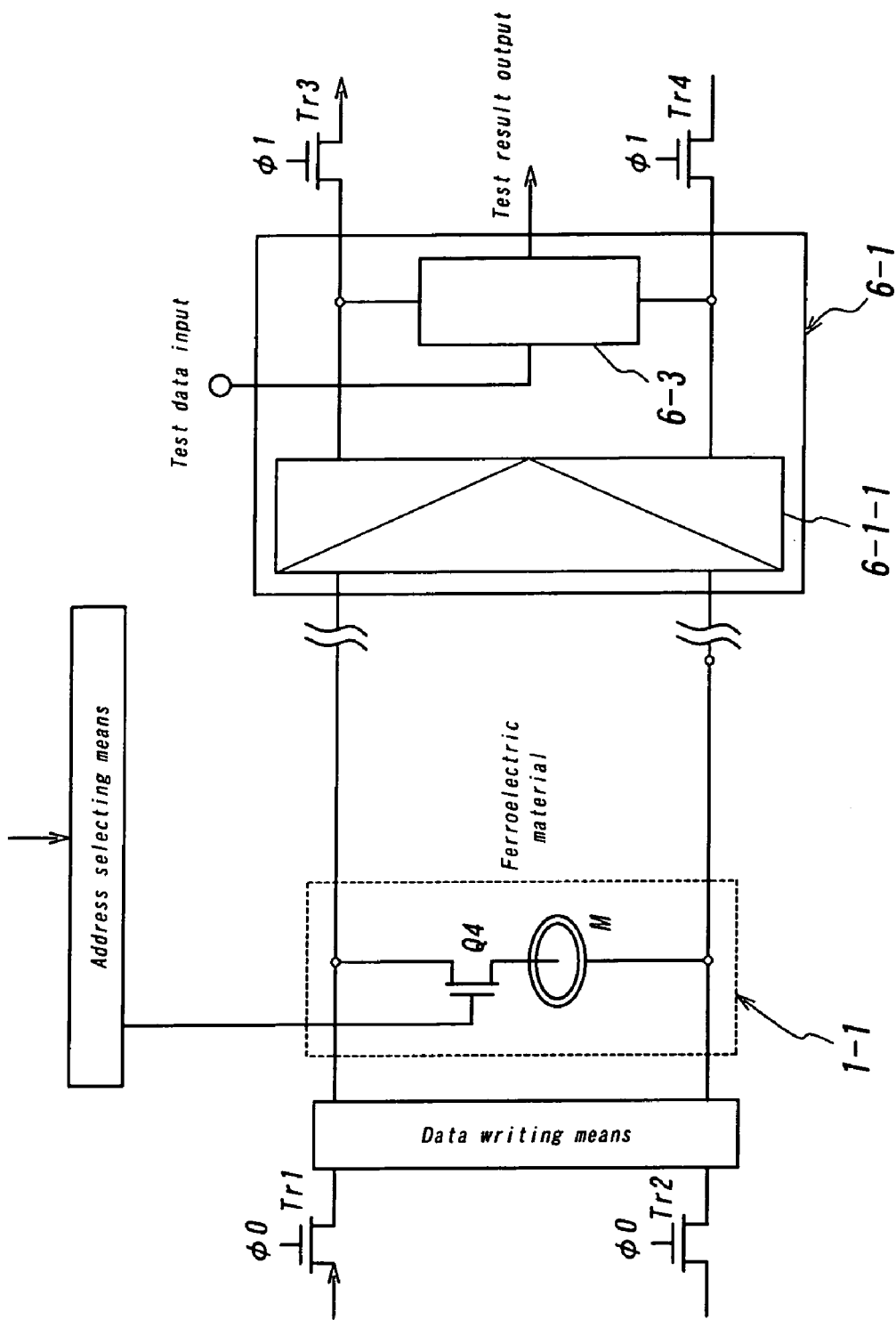
FIG. 20 is a view for showing an embodiment of a semiconductor memory adopting the MRAM illustrated in FIG. 10, in which a fault test is possible, according to the present invention.

As another example of the memory elements, FIG. 18 shows an embodiment in which the memory element is replaced with a non-volatile ferroelectric FeRAM, but the details thereof are omitted since it operates in a similar manner to the DRAM in FIG. 11. In addition, FIG. 19 shows an embodiment in which the memory element is an SRAM, whereas FIG. 20 shows the memory element is a nonvolatile MRAM, but in either case, the fault test works in a similar manner to that of the DRAM in FIG. 11, and thus the explanation thereof is omitted. It should be noted that the SRAM stores the information by maintaining the bi-stability of the flip-flop because power is constantly supplied thereto, and thus it is important that the power supply control gates p1 and p2 are ON normally whereas Q11 and Q12 are turned OFF by turning p1 and p2 OFF to stop when the fault occurs.

The present invention has the above-mentioned constructions. Thus, in a simple test for sorting the product of the semiconductor memories, the test items are limited to a stuck-at-1 fault and a stuck-at-0 fault, and they are detected separately from misreading in the read system. The invention provides a test method that makes possible the following:

(1) to carry out the test inside the semiconductor memory as far as possible,
(2) to have reduced additional circuit numbers,
(3) to eliminate the need for providing a specific, auxiliary of the test, and
(4) to recover defects and faults with limited resources, as well as a semiconductor memory that may be subjected to the test. Thus, the invention contributes to labor-savings and reduction in test time, and further exhibits excellent advantageous effects such as reduction in cost of semiconductor memory manufacturing or improvement in production yield.

The invention claimed is:

1. A semiconductor memory comprising:
A. a memory section including:
   (a) a memory element array comprising a plurality of memory elements;
   (b) address selecting means for selecting the memory elements according to one or a plurality of normal addresses supplied externally or according to one or a plurality of test addresses supplied externally or generated internally; and
   (c) data selecting means having data writing means for being driven for writing or reading one or a plurality of externally supplied normal data or internally generated test data, and data reading means having a complementary output section for reading stored data from the memory elements with a positive logic or a negative logic and for generating a pair of complementary outputs including a positive and a negative of the read value; and
B. a memory controlling section including:
   (d) computing means capable of performing inputting/outputting of, computing of, storing of, and controlling of data and control information;
   (e) a nonvolatile defect-and-fault recovery table for holding an inherent history of the semiconductor memory and for registering or updating one or a plurality of defects or faults according to a test result in a unit of address or in a unit of data selection path and alternative address(es) or alternative data selection path(s) with the units, the table being referred to for mapping; and
   (f) controlling and storing means for storing data, control or test information, or processing procedure thereof,
C. wherein the memory element array is tested by designating one or a plurality of externally or internally generated test addresses, writing and reading externally or internally generated test data, and comparing the test data with original test data, whereby a defect or a fault related to the one or the plurality of memory elements and the data reading means is detected, and with processing by an internal or external computing means, an address or a data selection path containing the defect or fault is registered or updated in the unit of address or in the unit of data selection path in the defect-and-fault recovery table so that the number thereof is minimized on the whole, and a location or region of the defect or the fault is mapped to an alternative location or region, whereby the location or region of the defect or the fault is recovered,
wherein, in the memory controlling section, the controlling and storing means for storing various information and process procedures perform, in addition to the storing, temporary storing of data or storing for temporary processing of data, so that asymmetry in terms of time between a write operation and a read operation of the memory element(s) is relaxed to attain a high-speed operation.

2. The semiconductor memory according to claim 1, wherein a fault in the data reading means is detected by a match between a pair of a positive and a negative complementary outputs obtained from the data reading means.

3. The semiconductor memory according to claim 1, wherein, for recovering a defect or a fault in the semiconductor memory, types of selection of the memory element(s) are categorized into three types being "write", "read", and "not-selected" so that one or a plurality of memory elements having a defect or a fault is/are not selected.

* * * * *